United States Patent
Kondo

(10) Patent No.: US 9,857,433 B2
(45) Date of Patent: Jan. 2, 2018

(54) LOAD TESTING APPARATUS

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 0 days.

(21) Appl. No.: 15/459,013

(22) Filed: Mar. 15, 2017

(65) Prior Publication Data

US 2017/0184686 A1   Jun. 29, 2017

Related U.S. Application Data

(63) Continuation of application No. PCT/JP2015/003663, filed on Jul. 22, 2015.

(30) Foreign Application Priority Data

Oct. 30, 2014   (JP) .................................. 2014-221021

(51) Int. Cl.
*G01R 31/42* (2006.01)
*G01R 17/02* (2006.01)

(52) U.S. Cl.
CPC .............. *G01R 31/42* (2013.01); *G01R 17/02* (2013.01)

(58) Field of Classification Search
CPC ........ G01R 31/42; G01R 17/02; G01R 31/40; G01R 31/025; G01R 19/16538

(Continued)

(56) References Cited

U.S. PATENT DOCUMENTS 5,789,723 A * 8/1998 Hirst ...................... G03G 15/80
                                                            219/216
5,914,588 A * 6/1999 Jiang ................... H02M 1/4208
                                                            323/267

(Continued)

FOREIGN PATENT DOCUMENTS

JP      S61-183829 A      8/1986
JP      H08-184615 A      7/1996
(Continued)

OTHER PUBLICATIONS

Translation of JP 5551324 (B1).*

(Continued)

*Primary Examiner* — Jermele M Hollington
*Assistant Examiner* — Christopher McAndrew
(74) *Attorney, Agent, or Firm* — Nakanishi IP Associates, LLC

(57) ABSTRACT

A load testing apparatus includes: a resistor unit that has a resistor group including relays and resistors and is connected to a power source to be tested to perform a load test; a selection switch that is used to select whether to supply power from the power source to be tested to the resistor group; an electrical signal detection unit that detects at least one of a voltage applied to the resistor unit and a current flowing through the resistor unit; and a control unit. The relay operates in response to an on/off state of the selection switch to control power supply from the power source to be tested to the resistor group including the relay. The control unit performs determination on whether the relay normally operates based on detection information including a time-series change of at least one of the voltage and the current when the selection switch is operated, which is information from the electrical signal detection unit, and performs off (Continued)

control to stop power supply from the power source to be tested to the resistor unit.

8 Claims, 16 Drawing Sheets

(58) Field of Classification Search
USPC .................................................. 324/764.01
See application file for complete search history.

(56) References Cited

U.S. PATENT DOCUMENTS

| | | | | |
|---|---|---|---|---|
| 6,618,276 | B2* | 9/2003 | Bennett | H01J 37/32082 |
| | | | | 363/52 |
| 6,621,719 | B2* | 9/2003 | Steimer | H02M 7/49 |
| | | | | 363/43 |
| 6,741,103 | B2* | 5/2004 | McKim, Jr. | G01R 19/14 |
| | | | | 327/307 |
| 7,397,676 | B2* | 7/2008 | Lincoln | H02H 7/122 |
| | | | | 363/56.01 |
| 7,944,273 | B1* | 5/2011 | Vinciarelli | H02M 1/32 |
| | | | | 327/531 |
| 7,960,951 | B2* | 6/2011 | Southwell | H02M 3/1584 |
| | | | | 323/220 |
| 8,844,366 | B2* | 9/2014 | Warren | G01Q 60/366 |
| | | | | 73/780 |
| 9,042,067 | B2* | 5/2015 | Fan | G01R 31/3606 |
| | | | | 361/91.1 |
| 9,118,206 | B2* | 8/2015 | Peterson | H01H 11/00 |
| 9,236,800 | B2* | 1/2016 | Tang | H02M 3/157 |
| 9,246,503 | B1* | 1/2016 | Hamilton | H03M 1/1085 |
| 9,705,523 | B1* | 7/2017 | Hamilton | H03M 1/1085 |
| 2003/0114963 | A1* | 6/2003 | Walker | G01R 21/133 |
| | | | | 700/291 |
| 2003/0161164 | A1* | 8/2003 | Shannon | H05B 41/2827 |
| | | | | 363/40 |
| 2006/0007719 | A1* | 1/2006 | Shannon | H05B 41/2827 |
| | | | | 363/132 |
| 2007/0257650 | A1* | 11/2007 | Southwell | H02M 3/1584 |
| | | | | 323/283 |
| 2008/0018284 | A1* | 1/2008 | Kinpara | H02P 21/14 |
| | | | | 318/490 |
| 2009/0251934 | A1* | 10/2009 | Shteynberg | H02M 3/155 |
| | | | | 363/81 |
| 2013/0113449 | A1* | 5/2013 | Pietri | G01R 31/40 |
| | | | | 323/283 |
| 2013/0214596 | A9* | 8/2013 | Peterson | H01H 11/00 |
| | | | | 307/23 |
| 2014/0055114 | A1* | 2/2014 | Tang | H02M 3/157 |
| | | | | 323/282 |
| 2014/0092512 | A1* | 4/2014 | Fan | G01R 31/3606 |
| | | | | 361/91.1 |

FOREIGN PATENT DOCUMENTS

| | | |
|---|---|---|
| JP | 2000-19231 A | 1/2000 |
| JP | 2007-10577 A | 1/2007 |
| JP | 5551324 B1 | 7/2014 |

OTHER PUBLICATIONS

Translation of JPH08184615 (A).*
International Search Report issued in PCT/JP2015/003663, dated Sep. 15, 2015, with translation (5 pages).
Written Opinion of the International Searching Authority issued in PCT/JP2015/003663, dated Sep. 15, 2015 (5 pages).
1st Office Action issued in Japanese Patent Application No. 2015-551077, dated Nov. 30, 2015, with English translation (7 pages).
2nd Office Action issued in Japanese Patent Application No. 2015-551077, dated Mar. 31, 2016, with English translation (10 pages).
Written Opinion of International Searching Authority issued in PCT/JP2015/003663, dated Sep. 15, 2015, with translation (11 pages).

* cited by examiner

LOAD TESTING APPARATUS

CROSS-REFERENCE TO RELATED APPLICATIONS

This application is a continuation application of International Patent Application No. PCT/JP2015/003663 filed on Jul. 22, 2015, which claims priority to Japanese Patent Application No. 2014-221021 filed on Oct. 30, 2014, the entire contents of which are incorporated by reference.

TECHNICAL FIELD

The present invention relates to a load testing apparatus.

BACKGROUND ART

Conventionally, a device that stops energization to a resistor in a case where a current flowing through the resistor or the like is abnormal in a load test has been proposed as in Patent Literature 1.

CITATION LIST

Patent Literature

Patent Literature 1: JP 2000-019231 A

SUMMARY OF INVENTION

Technical Problem

However, control based on failure of a relay, which is used for control of power supply to resistor is not considered although control based on failure of the resistor is possible.

Accordingly, an object of the present invention is to provide a load testing apparatus that is capable of suitably performing abnormality detection based on failure of a relay.

Solution to Problem

A load testing apparatus according to the present invention includes: a resistor unit that has a resistor group including relays and resistors and is connected to a power source to be tested to perform a load test; a selection switch that is used to select whether to supply power from the power source to be tested to the resistor group; an electrical signal detection unit that detects at least one of a voltage applied to the resistor unit and a current flowing through the resistor unit; and a control unit. The relay operates in response to an on/off state of the selection switch to control power supply from the power source to be tested to the resistor group including the relay. The control unit performs determination on whether the relay normally operates based on detection information including a time-series change of at least one of the voltage and the current when the selection switch is operated, which is information from the electrical signal detection unit, and performs off control to stop power supply from the power source to be tested to the resistor unit when it is determined that the relay does not normally operate.

A change of the waveform immediately after the operation of the selection switch is highly likely to be caused by failure (particularly, contact failure) of the relay corresponding to the operated selection switch rather than by failure of the resistor.

Thus, it is possible to determine whether the relay corresponding to the operated selection switch normally operates by comparing the detection information (detection voltage waveform), which includes the time-series change of the voltage when the selection switch is operated, with the reference information recorded in advance such as the normal voltage waveform.

Preferably, the control unit performs comparison between reference information and the detection information, and performs the determination based on a result of the comparison. The reference information is information of the time-series change of at least one of the voltage and the current when the selection switch is operated, and is recorded in advance before performing the load test. When the power source to be tested is an AC power source, the comparison is performed using the reference information and the detection information from which a sine wave, obtained based on an AC waveform of power supplied from the power source to be tested to the resistor unit, is removed.

More preferably, a warning unit that outputs information using at least one of light and sound during the off control is further provided. The control unit outputs information about a relay, which is determined not to normally operate among the relays based on the result of the comparison, to the warning unit during the off control.

More preferably, the power source to be tested is an AC power source. The electrical signal detection unit includes a first voltage detection unit which detects a voltage applied to a resistor for U-phase and a resistor for V-phase in the resistor unit, a second voltage detection unit which detects a voltage applied to the resistor for the V-phase and a resistor for W-phase in the resistor unit, and a third voltage detection unit which detects a voltage applied to the resistor for the W-phase and the resistor for the U-phase. The detection information is information from the first voltage detection unit, the second voltage detection unit, and the third voltage detection unit.

It is also possible to specify the relay RS having the abnormality. In other words, it is possible to determine if the abnormal relay is the one for the U-phase wire, the V-phase wire, or the W-phase wire.

In addition, preferably, the power source to be tested is an AC power source. The electrical signal detection unit includes a first current detection unit which detects a current flowing through a resistor for U-phase in the resistor unit, a second current detection unit which detects a current flowing through a resistor for V-phase in the resistor unit, and a third current detection unit which detects a current flowing through a resistor for W-phase in the resistor unit. The detection information is information from the first current detection unit, the second current detection unit, and the third current detection unit.

In addition, preferably, a reference waveform region as the reference information, which includes a waveform representing the time-series change of at least one of the voltage and the current when the selection switch is operated and is represented in a curve having a constant width, is compared with the detection information. The control unit performs the determination based on a length of a time zone of a waveform representing the detection information that is included in the reference waveform region when the waveform representing the detection information is superimposed on the reference waveform region.

In addition, preferably, a reference waveform region as the reference information, which includes a waveform representing the time-series change of at least one of the voltage and the current when the selection switch is operated and the relay normally operates in response to the operation of the selection switch, and is represented in a curve having a constant width, compared with the detection information. The control unit performs the off control in a case where a length of a time zone of a waveform representing the detection information that is included in the reference waveform region is shorter than a first threshold when the waveform representing the detection information is superimposed on the reference waveform region.

More preferably, a warning unit that outputs information using at least one of light and sound during the off control is further provided. The control unit does not perform the off control but causes the warning unit to output the information in a case where the length of the time zone of the waveform representing the detection information that is included in the reference waveform region is equal to or longer than the first threshold and is shorter than a second threshold, which is larger than the first threshold, when the waveform representing the detection information is superimposed on the reference waveform region.

Through such warning, time for replacement of the relay can be notified before the load testing apparatus is incapable of normally operating due to a malfunction.

The detection information may be defined as a time-series change of at least one of the voltage and the current. More specifically, the information may be related with a period from the time at which the selection switch is operated to the time at which at least one of the voltage and the current becomes a steady state. When the power source to be tested is an AC power source, the detection information is set to time until at least one of the voltage and the current becomes the steady state, in the detection information from which a sine wave, obtained based on an AC waveform of power supplied from the power source to be tested to the resistor unit, is removed.

In addition, preferably, the control unit performs the determination based on the detection information for a certain period of time from the operation of the selection switch.

Advantageous Effects of Invention

As above, it is possible to provide the load testing apparatus that is capable of suitably performing the abnormality detection based on the failure of the relay according to the present invention.

DESCRIPTION OF EMBODIMENTS

Figure 1:
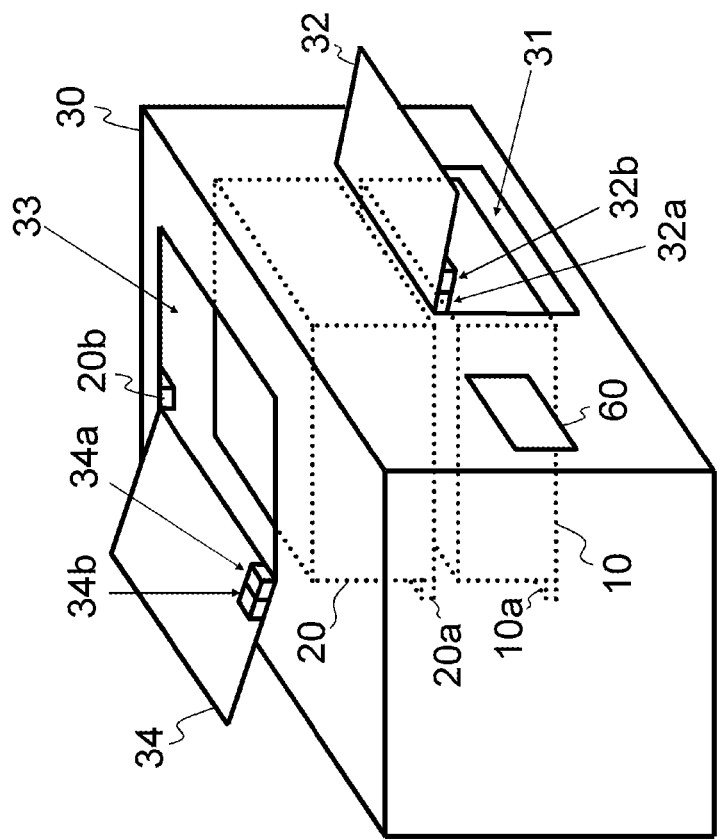
FIG. 1 is a perspective view illustrating a configuration of a load testing apparatus according to the present embodiment.
Figure 2:
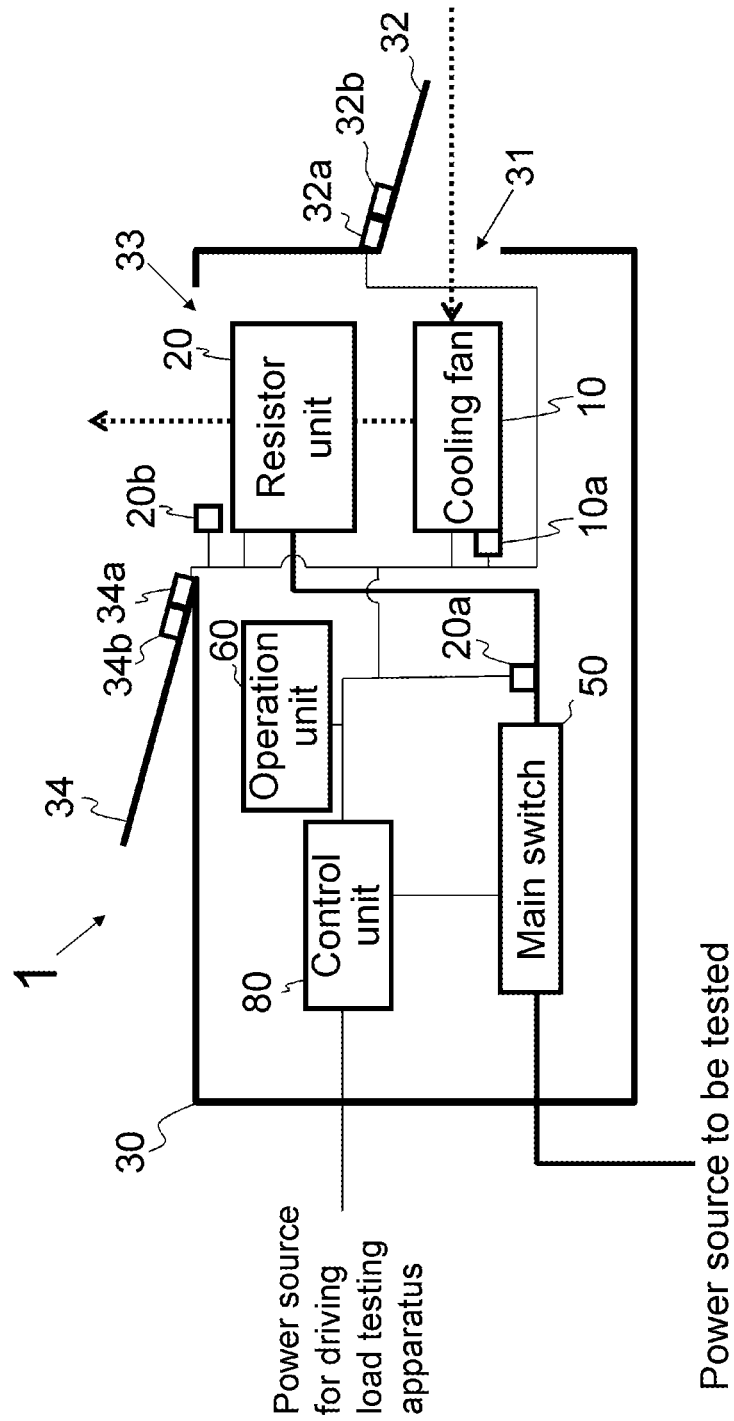
FIG. 2 is a schematic view illustrating the configuration of the load testing apparatus.

Hereinafter, the present embodiment will be described with reference to the drawings. A load testing apparatus 1 according to a first embodiment is provided with a cooling fan 10, a resistor unit 20, a housing 30, a main switch 50, an operation unit 60, and a control unit 80 and is used to perform load test of a power source device (power source to be tested) such as a power generator (see FIGS. 1 to 13).

The cooling fan 10 is a device that blows cooling air to the resistor unit 20, and the resistor unit 20 is arranged above the cooling fan 10. Although the description is given in the present embodiment regarding a mode where the cooling fan 10 and the resistor unit 20 are vertically stacked, the cooling fan 10 and the resistor unit 20 may be provided in a mode of being arranged side by side in the lateral direction.

A rotation state detection unit 10a, such as a fiber sensor, a laser sensor, a photoelectric sensor, and a wind pressure sensor, that detects a rotation state of a fan is provided in the cooling fan 10.

The rotation state detection unit 10a detects rotation speed of the cooling fan 10 and transmits information about the rotation speed to the control unit 80.

The resistor unit 20 is a unit provided with one or more resistor groups where a plurality of bar-shaped resistors extending in the horizontal direction are aligned with a predetermined interval therebetween and are connected in series or in parallel, and power from the power source to be tested is supplied to some or all of the resistor groups during the load test. The resistor is not limited to a resistor configured using an electrical heating wire and may be a resistor, such as a battery, that is capable of accumulating power therein.

The present embodiment gives an example where a total of four resistor groups including two resistor groups (a first resistor group G1 and a second resistor group G2) with the rated capacity of 5 kW and two resistor groups (a third resistor group G3 and a fourth resistor group G4) with a rated capacity of 10 kW are provided for a load test of a three-phase AC power source.

Each resistor group is provided with two resistors (a first resistor $R_1$ and a second resistor $R_2$) connected in series for a U-phase to be connected to an R-phase terminal of the power source to be tested, two resistors (a third resistor $R_3$ and a fourth resistor $R_4$) connected in series for a V-phase to be connected to an S-phase terminal of the power source to be tested, two resistors (a fifth resistor $R_5$ and a sixth resistor $R_4$) connected in series for a W-phase to be connected to a T-phase terminal of the power source to be tested, a relay RS between the first resistor $R_1$ and the second resistor $R_2$, a relay RS between the third resistor $R_3$ and the fourth resistor $R_4$, and a relay RS between the fifth resistor $R_5$ and the sixth resistor $R_3$.

Figure 3:
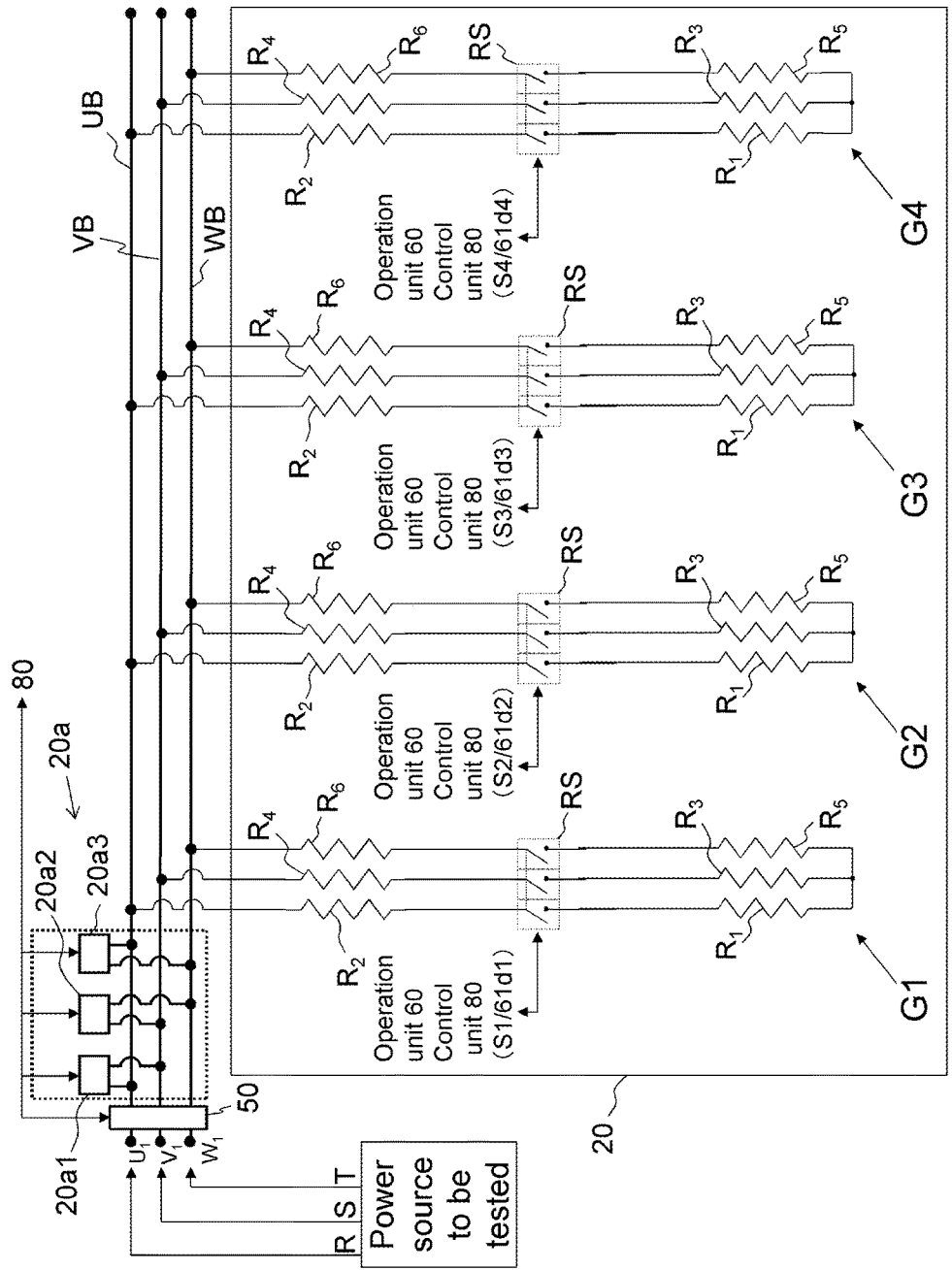
FIG. 3 is a schematic view illustrating a circuit configuration of a resistor unit which includes a first voltage detection unit to a third voltage detection unit.

The relay RS is on/off controlled corresponding to each on/off operation of the first switch 31 to the fourth switch S4, which will be described below, and causes the current to flow through the corresponding resistor in an on state. As illustrated in FIG. 3, the relay RS may be a triple-unit switch where a relay for the U-phase, a relay for the V-phase, and a relay for the W-phase perform the on/off operation by linking with each other, or may be a single-unit switch where the respective relays perform the on/off operation independently.

One terminal of the second resistor $R_2$ in each of the resistor groups is connected to a wire UB for the U-phase that extends from a U-phase terminal $U_1$ connected to the R-phase terminal of the power source to be tested, one terminal of the fourth resistor $R_4$ is connected to a wire VB for the V-phase that extends from a V-phase terminal $V_1$ connected to the S-phase terminal of the power source to be tested, and one terminal of the sixth resistor $R_6$ is connected to a wire WB for the W-phase that extends from a W-phase terminal $W_1$ connected to the T-phase terminal of the power source to be tested.

In each of the resistor groups, one terminal of the first resister $R_1$, one terminal of the third resistor $R_3$, and one terminal of the fifth resistor $R_5$ are short-circuited.

However, the number of the resistor groups, the rated voltages or the rated capacities thereof, the wiring of the resistors and the relay, and arrangement of a voltmeter (or an ammeter) to be described later are not limited to the above-described configuration.

An electrical signal detection unit 20a, which is connected to a bus bar and an electric cable connected to the resistor, such as the voltmeter, and detects a voltage applied to the resistor unit 20, is provided between the resistor unit 20 and the main switch 50 (or between the power source to be tested and the main switch 50), and a temperature detection unit 20b which detects an exhaust temperature of the cooling wind is provided at a downstream side (upper part) of the flow of the cooling wind of the resistor unit 20.

The electrical signal detection unit 20a detects the voltage applied to the resistor unit 20 and transmits information about the voltage to the control unit 80.

The electrical signal detection unit 20a includes a first voltage detection unit 20a1 to a third voltage detection unit 20a3.

The first voltage detection unit 20a1 has one end, which is connected between the resistor unit 20 and the main switch 50 (or between the power source to be tested and the main switch 50) on the U-phase wire UB extending from the U-phase terminal $U_1$ connected to the R-phase terminal of the power source to be tested, and the other end, which is connected between the resistor unit 20 and the main switch 50 (or between the power source to be tested and the main switch 50) on the V-phase wire VB extending from the V-phase terminal $V_1$ connected to the S-phase terminal of the power source to be tested, and detects voltages to be applied to the resistors for the U-phase (the first resistor $R_1$ and the second resistor $R_2$) and the resistors for the V-phase (the third resistor $R_3$ and the fourth resistor $R_4$).

The second voltage detection unit 20a2 has one end, which is connected between the resistor unit 20 and the main switch 50 (or between the power source to be tested and the main switch 50) on the V-phase wire VB, and the other end, which is connected between the resistor unit 20 and the main switch 50 (or between the power source to be tested and the main switch 50) on the W-phase wire WB extending from the W-phase terminal $W_1$ connected to the T-phase terminal of the power source to be tested, and detects voltages to be applied to the resistors for the V-phase (the third resistor $R_3$ and the fourth resistor $R_4$) and the resistors for the W-phase (the fifth resistor $R_5$ and the sixth resistor $R_6$).

The third voltage detection unit 20a3 has one end, which is connected between the resistor unit 20 and the main switch 50 (or between the power source to be tested and the main switch 50) on the W-phase wire WB, and the other end, which is connected between the resistor unit 20 and the main switch 50 (or between the power source to be tested and the main switch 50) on the U-phase wire UB, and detects voltages to be applied to the resistors for the W-phase (the fifth resistor $R_5$ and the sixth resistor $R_6$) and the resistors for the U-phase (the first resistor $R_1$ and the second resistor $R_2$).

The temperature detection unit 20b detects the exhaust temperature of the upper part (downstream side) of the resistor unit 20 and transmits information about the exhaust temperature to the control unit 80.

The housing 30 is a case that holds the load testing apparatus such as the cooling fan 10, the resistor unit 20, the main switch 50, the operation unit 60, and the control unit 80. In the housing 30, an intake port 31 is provided on a lower side surface (upstream side) of the cooling fan 10, and an exhaust port 33 is provided on an upper side (downstream side) of the resistor unit 20.

An intake lid 32, which is opened when being used and closed when not being used, is provided in the intake port 31, and an exhaust lid 34, which is opened when being used and closed when not being used, is provided in the exhaust port 33.

The intake lid 32 is opened and closed via a first actuator 32a that operates by linking with an on/off operation of the operation unit 60 (on/off operation switch 60a). The intake lid 32 is provided with an intake opening detection unit 32b that is configured using a proximity sensor, a limit switch, or the like and detects an opened/closed state of the intake lid 32, that is, whether the intake port 31 is opened. Incidentally, the invention is not limited to automatic opening and closing using the first actuator 32a, but may have a mode where the intake lid 32 is manually opened and closed.

The intake opening detection unit 32b detects whether the intake lid 32 is opened and transmits information about whether the intake lid 32 is opened to the control unit 80. However, the intake opening detection unit 32b may have a mode of detecting a degree of opening/closing of the intake lid 32 further minutely.

The exhaust lid 34 is opened and closed via a second actuator 34a that operates by linking with the on/off operation of the operation unit 60 (on/off operation switch 60a). The exhaust lid 34 is provided with an exhaust opening detection unit 34b that is configured using a proximity sensor, a limit switch, or the like and detects an opened/closed state of the exhaust lid 34, that is, whether the exhaust port 33 is opened. Incidentally, the invention is not limited to automatic opening and closing using the second actuator 34a, but may have a mode where the exhaust lid 34 is manually opened and closed.

The exhaust opening detection unit 34b detects whether the exhaust lid 34 is opened and transmits information about whether the exhaust lid 34 is opened to the control unit 80. However, the exhaust opening detection unit 34b may have a mode of detecting a degree of opening/closing of the exhaust lid 34 further minutely.

In the present embodiment, the description is given regarding a mode where any of the intake lid 32 and the exhaust lid 34 is configured using a hinged door via a hinge, but the intake lid 32 or the exhaust lid 34 may be configured in a mode of using another door structure such as a sliding door.

The main switch 50 is configured using a vacuum circuit breaker (VCB) and the like, is connected between the resistor unit 20 and the power source to be tested (provided on the U-phase wire UB, on the V-phase wire VB, and on the W-phase wire WB). The power from the power source to be tested is supplied to the resistor unit 20 in the on state, and the power supply from the power source to be tested to the resistor unit 20 is stopped in an off state.

While the load testing apparatus 1 is normally operating, the main switch 50 is set to the on state. The main switch 50 is set to the off state, that is, the off control that stops the power supply from the power source to be tested to the resistor unit 20 is performed in a case where the control unit 80 determines that any of the members forming the load testing apparatus 1 does not normally operate (in a case where an abnormality is detected) based on the information from the respective detection units.

The operation unit 60 is provided with an on/off operation switch 60a, which turns a power source of the load testing apparatus 1 into the on state or the off state, and a selection switch 60b (the first switch S1 to the fourth switch S4) that adjusts a load amount (selects the resistor group to which the power supply from the power source to be tested is performed).

When the main power source of the load testing apparatus 1 is turned on by operating the on/off operation switch 60a, the first actuator 32a operates to open the intake lid 32, and the second actuator 34a operates to open the exhaust lid 34 based on power supplied from a power source for driving the load testing apparatus (auxiliary power source). A fan in the cooling fan 10 rotates to feed air taken in from an opening part of the intake lid 32 to the resistor unit 20 on the upper side. In addition, the control unit 80, the rotation state detection unit 10a, the electrical signal detection unit 20a, the temperature detection unit 20b, the intake opening detection unit 32b, and the exhaust opening detection unit 34b operate based on the power supplied from the power source for driving the load testing apparatus (auxiliary power source).

It may be a mode where an on/off switch for the cooling fan 10 is provided separately from the on/off operation switch 60a, and the rotation of the fan of the cooling fan 10 is started by operating the on/off switch for the cooling fan 10 in a state where the main power source of the load testing apparatus 1 is turned on by operating the on/off operation switch 60a.

After the main power source of the load testing apparatus 1 is turned on, the main switch 50 is turned on when the selection switch 60b (the first switch S1 to the fourth switch S4) is operated to be a state that enables energization to the resistor unit 20. Then, the relay RS of the resistor group corresponding to the selection switch 60b (the first switch S1 or the like) that has selected the energization is turned on, and the power is supplied from the power source to be tested connected via the main switch 50 to the resistor group that can be energized in the resistor unit 20.

For example, when it is operated such that the first switch S1 and the second switch S2 are turned on and the third switch S3 and the fourth switch S4 are turned off, the relays RS of the first resistor group G1 and the second resistor group G2 with the rated capacity of 5 kW corresponding to the first switch S1 and the second switch S2 are turned on, and the power from the power source to be tested is supplied to the first resistor group G1 and the second resistor group G2. Further, the relays RS of the third resistor group G3 and the fourth resistor group G4 with the rated capacity of 10 kW corresponding to the third switch S3 and the fourth switch S4 are turned off, and the power from the power source to be tested is not supplied to the third resistor group G3 and the fourth resistor group G4.

The operation unit 60 is provided with an intake lid warning unit 61a, an exhaust lid warning unit 61b, a cooling fan warning unit 61c, a current/voltage warning unit 61d, and a temperature warning unit 61e. The intake lid warning unit 61a, the exhaust lid warning unit 61b, the cooling fan warning unit 61c, the current/voltage warning unit 61d, and the temperature warning unit 61e perform output for warning depending on failure of each state of the members corresponding to the intake lid warning unit 61a, the exhaust lid warning unit 61b, the cooling fan warning unit 61c, the current/voltage warning unit 61d, and the temperature warning unit 61e (see FIG. 4).

The intake lid warning unit 61a is provided in the vicinity of a column "Intake Lid" provided in the operation unit 60 and is lit up for warning when the intake lid 32 is not sufficiently opened to indicate that the off control is based on the information from the intake opening detection unit 32b using light.

The exhaust lid warning unit 61b is provided in the vicinity of a column "Exhaust Lid" provided in the operation unit 60 and is lit up for warning when the exhaust lid 34 is not sufficiently opened to indicate that the off control is based on the information from the exhaust opening detection unit 34b using light.

The cooling fan warning unit 61c is provided in the vicinity of a column "Cooling Fan" provided in the operation unit 60 and is lit up for warning when the cooling fan 10 does not normally operate to indicate that the off control is based on the information from the rotation state detection unit 10a using light.

Each of a first warning unit 61d1 to a fourth warning unit 61d4 included in the current/voltage warning unit 61d is provided in the vicinity of each of the first switch S1 to the fourth switch S4, and is lit up for warning in a case where a time-series change of a voltage (voltage waveform) applied to the resistor unit 20 is not normal when the selection switch 60b (the first switch S1 to the fourth switch S4) is operated to indicate that the off control is based on the information from the electrical signal detection unit 20a using light.

For example, in a case where the time-series change of the voltage (voltage waveform) applied to the resistor unit 20 is not normal when the first switch S1 is operated, the first warning unit 61d1 of the current/voltage warning unit 61d, provided in the vicinity of the first switch S1, is lit up for warning to indicate that the off control is based on the information from the electrical signal detection unit 20a caused by the operation of the first switch S1 using light.

In addition, in a case where the time-series change of the voltage (voltage waveform) applied to the resistor unit 20 is not normal when the first switch S1 and the second switch S2 are operated substantially at the same time, the first warning unit 61*d*1 provided in the vicinity of the first switch S1 and the second warning unit 61*d*2 provided in the vicinity of the second switch S2, in the current/voltage warning unit 61*d*, are lit up for warning to indicate that the off control is based on the information from the electrical sinal detection unit 20*a* caused by the operation of the first switch S1 and the second switch S2 using light.

The temperature warning unit 61*e* is provided in the vicinity of a column "Exhaust Temperature" provided in the operation unit 60 and is lit up for warning when the exhaust temperature is high and the resistor is not normally cooled to indicate that the off control is based on the information from the temperature detection unit 20*b* using light.

Any of the intake lid warning unit 61*a*, the exhaust lid warning unit 61*b*, the cooling fan warning unit 61*c*, the current/voltage warning unit 61*d*, the temperature warning unit 61*e* may have a mode of performing the lighting during the normal operation using a different color (for example, lighting in green) in addition to the lighting for warning (for example, lighting in red).

The control unit 30 is a device that controls the respective units of the load testing apparatus 1, such as the relay RS, the cooling fan 10, and the main switch 50, and particularly, performs the off control (off control of the power supply from the power source to be tested to the resistor unit 20) of the main switch 50 upon detecting an operating condition of the cooling fan 10 using the rotation state detection unit 10*a*, an operating condition (condition of the voltage applied to the resistor unit 20) of the relay RS of the resistor group corresponding to the selection switch 60*b* (the first switch S1 to the fourth switch S4) using the electrical signal detection unit 20*a*, an opened state of an opening part (the intake port 31 or the exhaust port 33) in the housing 30 using the intake opening detection unit 32*b* or the exhaust opening detection unit 34*b*, and the exhaust temperature at the downstream side of the resistor unit 20 using the temperature detection unit 20*b*. That is, the control unit 80 performs the off control based on the information from the intake opening detection unit 32*b*, the information from the exhaust opening detection unit 34*b*, the information from the rotation state detection unit 10*a*, the information from the electrical signal detection unit 20*a*, and the information from the temperature detection unit 20*b*.

Figure 5:
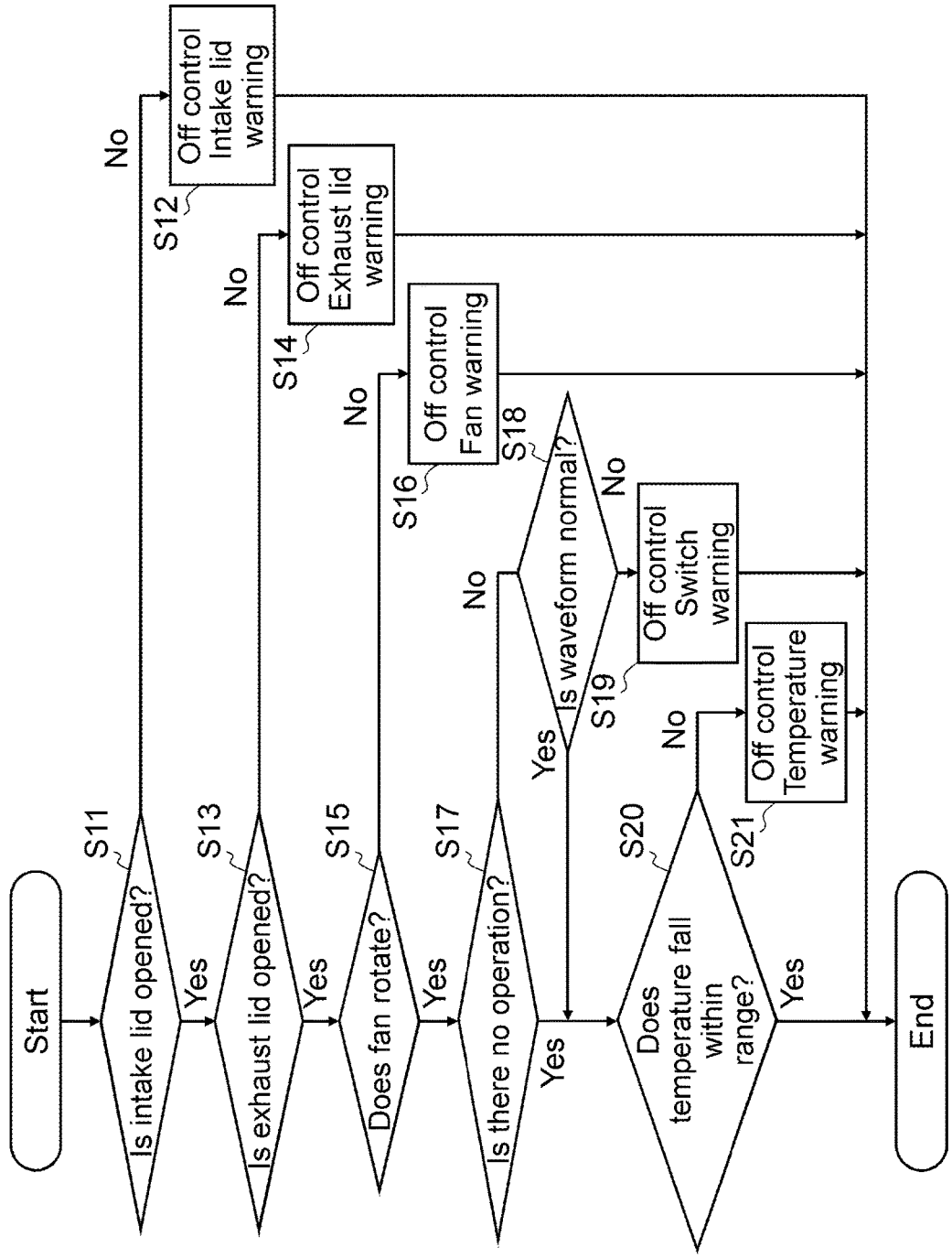
FIG. 5 is a flowchart illustrating an operating procedure of off control.

A procedure of the off control performed by the control unit 80 will be described with reference to the flowchart of FIG. 5. The control from step S11 to step S21 is performed every first time t1 (for example, 60 sec) until the off control is performed after the main power source of the load testing apparatus 1 is turned on. Incidentally, it is desirable that the procedure in step S11 or the like be started not immediately after the main power source of the load testing apparatus 1 is turned on but after the elapse of a time required for opening of the intake lid 32 and the exhaust lid 34 performed by the first actuator 32*a* and the second actuator 34*a*.

The control unit 80 determines whether the intake lid 32 is sufficiently opened (see step S11) based on the information from the intake opening detection unit 32*b* about the opened/closed state of the intake lid 32, and turns the main switch 50 into the off state to stop the power supply from the power source to be tested to the resistor unit 20 of the load testing apparatus 1 when it is determined that the intake lid 32 is not opened. In addition, the control unit 80 performs warning to indicate "the intake port 31 is not normally opened" (see step S12).

Figure 4:
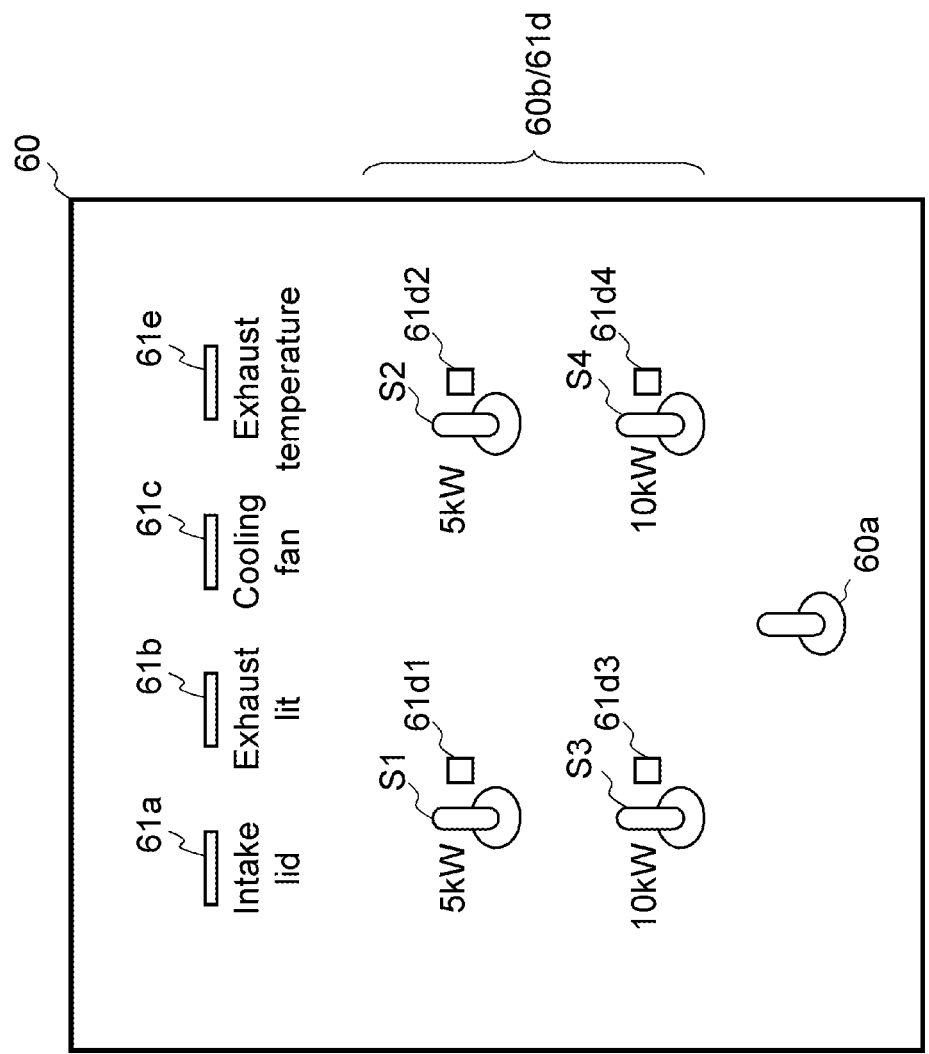
FIG. 4 is a schematic view illustrating a configuration of an operation unit.

It is possible to consider a mode of lighting up the intake lid warning unit 61*a*, provided in the vicinity of the column "Intake Lid" in the operation unit 60 as an example of the warning (see FIG. 4). In addition, the warning may be performed in a mode of providing a display device 70 capable of displaying characters in the operation unit 60 or the like and displaying a message saying "Since the intake port is not sufficiently opened, open the intake lid".

The control unit 80 determines whether the exhaust lid 34 is sufficiently opened (see step S13) based on the information from the exhaust opening detection unit 34*b* about the opened/closed state of the exhaust lid 34, and turns the main switch 50 into the off state to stop the power supply from the power source to be tested to the resistor unit 20 of the load testing apparatus 1 when it is determined that the exhaust lid 34 is not opened. In addition, the control unit 80 performs warning to indicate "the exhaust port 33 is not normally opened" (see step S14).

It is possible to consider a mode of lighting up the exhaust lid warning unit 61*b*, provided in the vicinity of the column "Exhaust Lid" in the operation unit 60 as an example of the warning. In addition, the warning may be performed in a mode of providing the display device 70 capable of displaying characters in the operation unit 60 or the like and displaying a message saying "Since the exhaust port is not sufficiently opened, open the exhaust lid".

The control unit 80 determines whether the cooling fan 10 sufficiently operates (for example, whether the cooling fan 10 rotates at the rotation speed equal to or higher than a threshold) (see step S15) based on the information from the rotation state detection unit 10*a* about the rotation speed of the cooling fan 10, and turns the main switch 50 into the off state to stop the power supply from the power source to be tested to the resistor unit 20 of the load testing apparatus 1 when it is determined that the cooling fan 10 does not operate. In addition, the control unit 80 performs warning to indicate "the cooling fan 10 does not normally operate" (see step S16).

It is possible to consider a mode of lighting up the cooling fan warning unit 61*c*, provided in the vicinity of the column "Cooling Fan" in the operation unit 60 as an example of the warning. In addition, the warning may be performed in a mode of providing the display device 70 capable of displaying characters in the operation unit 60 or the like and displaying a message saying "Since the cooling fan does not sufficiently operate, confirm the cooling fan".

The control unit 80 determines whether the voltage applied to the resistor unit 20 falls within a range during the normal operation based on the information from the electrical signal detection unit 20*a* about the voltage applied to the resistor unit 20 and turns the main switch 50 into the off state to stop the power supply from the power source to be tested to the resistor unit 20 of the load testing apparatus 1 when it is determined that the voltage is out of the range during the normal operation. In addition, the control unit 80 performs warning to indicate "the waveform of the voltage applied to the resistor unit 20 during the switch operation is not normal" (see steps S17 to S19).

To be specific, the control unit 80 records the voltage waveform (detection voltage waveform or detection information) which is obtained from the first voltage detection unit 20*a*1 to the third voltage detection unit 20*a*3 and represents changes of a voltage value in a time-series manner (for example, updates every 1 ms).

Figure 6:
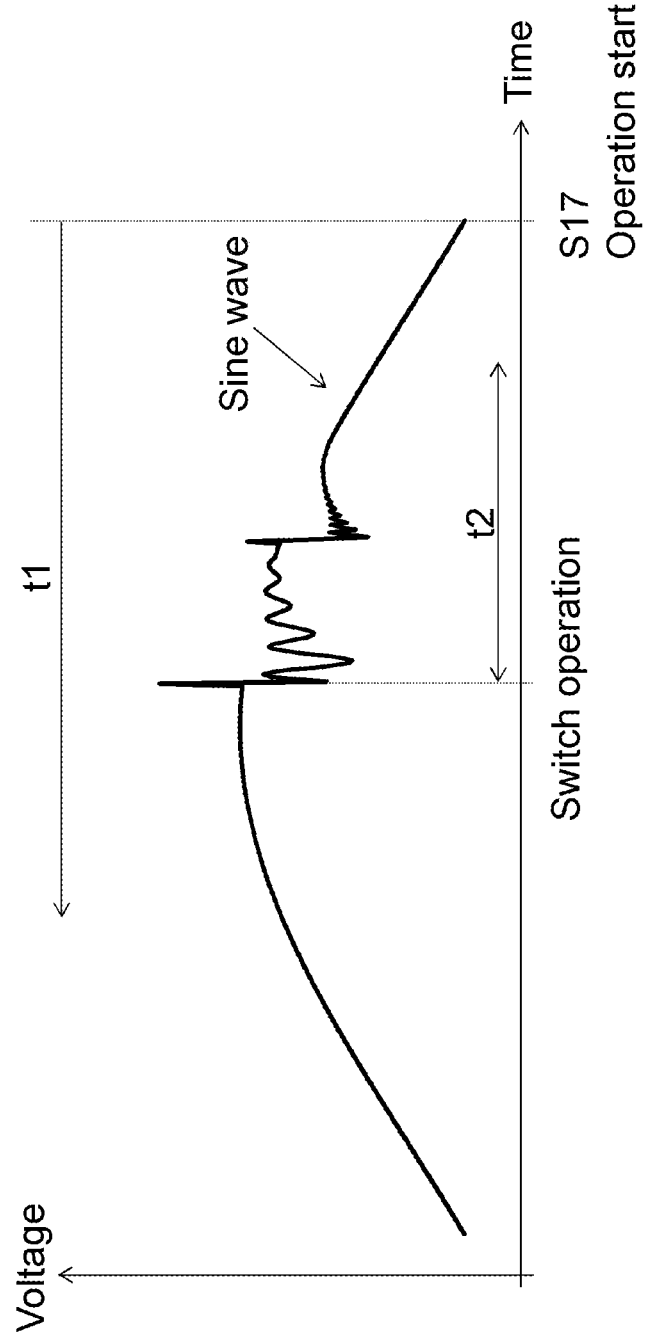
FIG. 6 is a graph illustrating an example of a detection voltage waveform at an abnormal time which includes a sine wave based on power from a power source to be tested.
Figure 7:
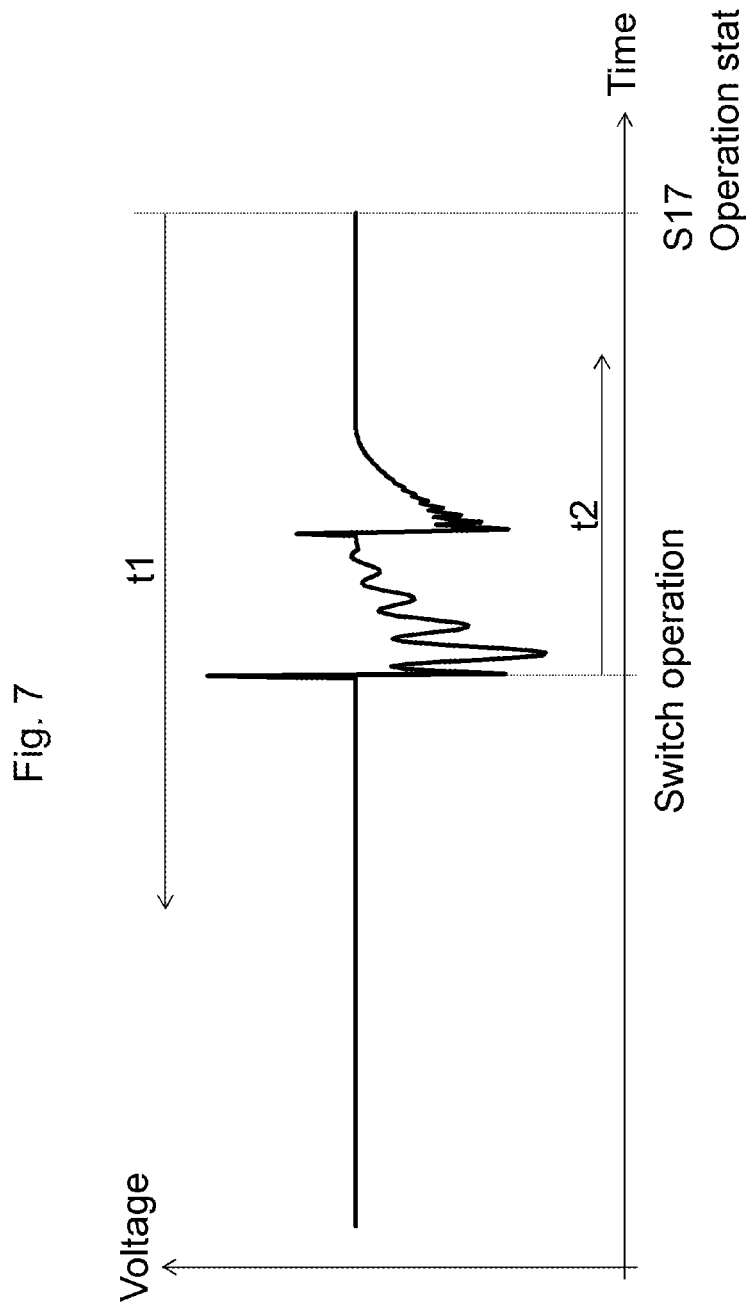
FIG. 7 is a graph illustrating the voltage waveform of FIG. 6 from which the sine wave based on the power from the power source to be tested is removed.
Figure 8:
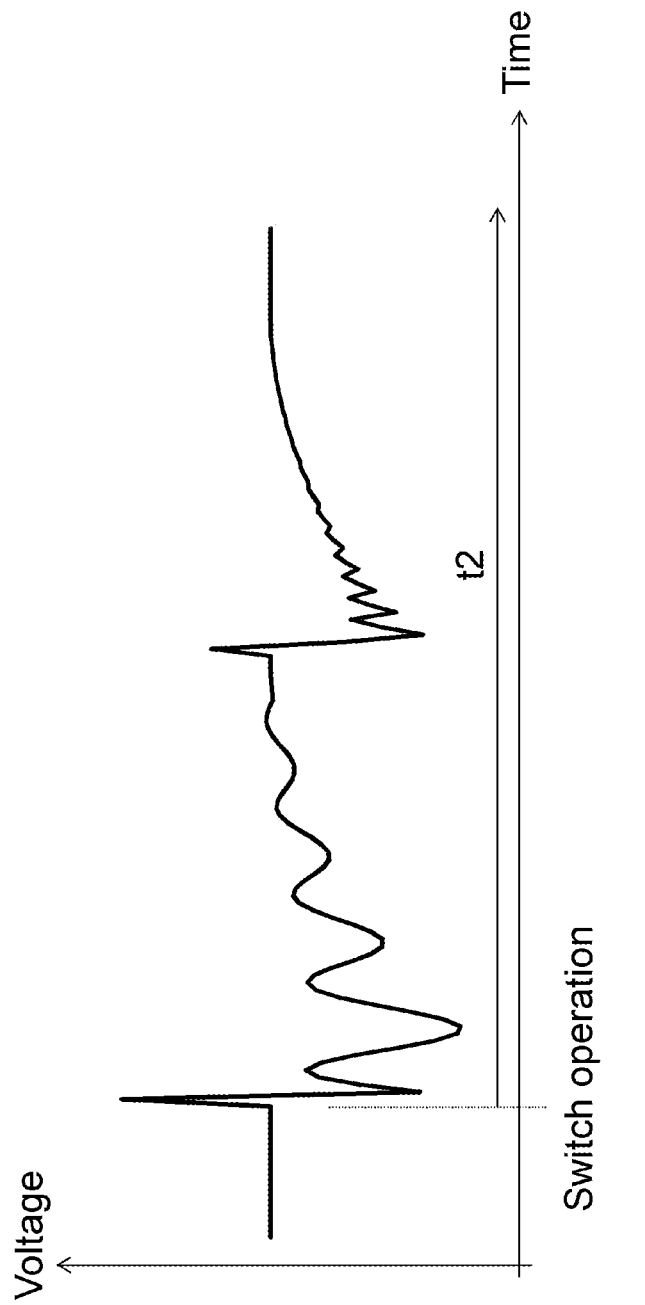
FIG. 8 is a graph illustrating the voltage waveform of FIG. 7 until the elapse of a second time period after a switch operation is performed.
Figure 9:
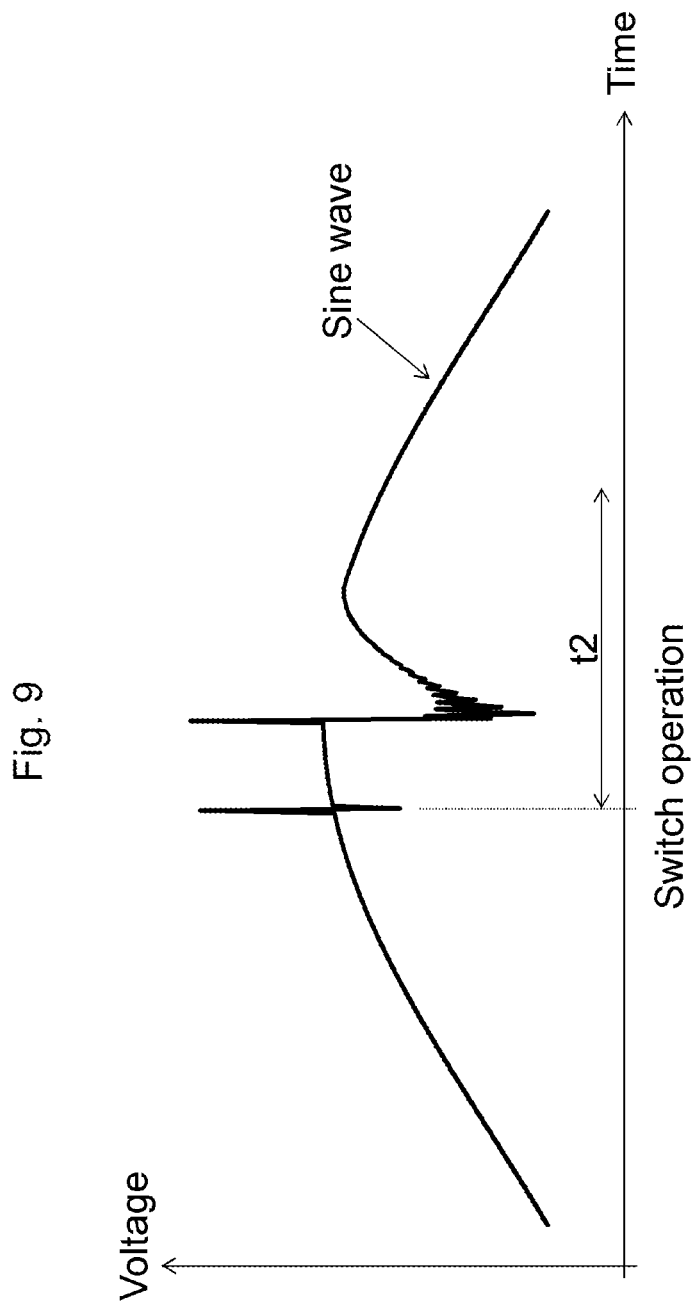
FIG. 9 is a graph illustrating an example of a voltage waveform at a normal time which includes a sine wave based on the power from the power source to be tested.

This voltage waveform (detection voltage waveform) to be obtained from the first voltage detection unit 20a1 to the third voltage detection unit 20a3 and recorded in the control unit 80 or the like is obtained by removing a sine wave, based on an AC waveform of the power supplied from the power source to be tested to the resistor unit 20, from an approximate sine waveform (see FIG. 6) obtained by arranging the detected voltage values in a time-series manner, and thus, shows a substantially constant waveform except for a voltage change when the relay RS is changed from the on state to the off state or from the off state to the on state (see FIG. 7).

Incidentally, the calculation of removing the sine waveform is not performed in a case where the detected waveform does not include the sine wave corresponding to the power from the power source to be tested, such as a case where the power source to be tested is a DC power source.

The control unit 80 determines whether any of the selection switches 60b (the first switch S1 to the fourth switch S4) is operated during the past first time t1 dating back from the present time point (operation start time point in step S17) in the detection voltage waveform (see step S17).

When any of the selection switches 60b (the first switch S1 to the fourth switch S4) is operated during the past first time t1 in the detection voltage waveform, the control unit 80 compares a voltage waveform (see FIG. 8) in a second time period t2 (<t1, for example, 1 ms) from the time at which the switch is operated with a voltage waveform (normal voltage waveform or reference information) obtained in the case of being normally operated in the same switch operation state (see step S18).

Figure 10:
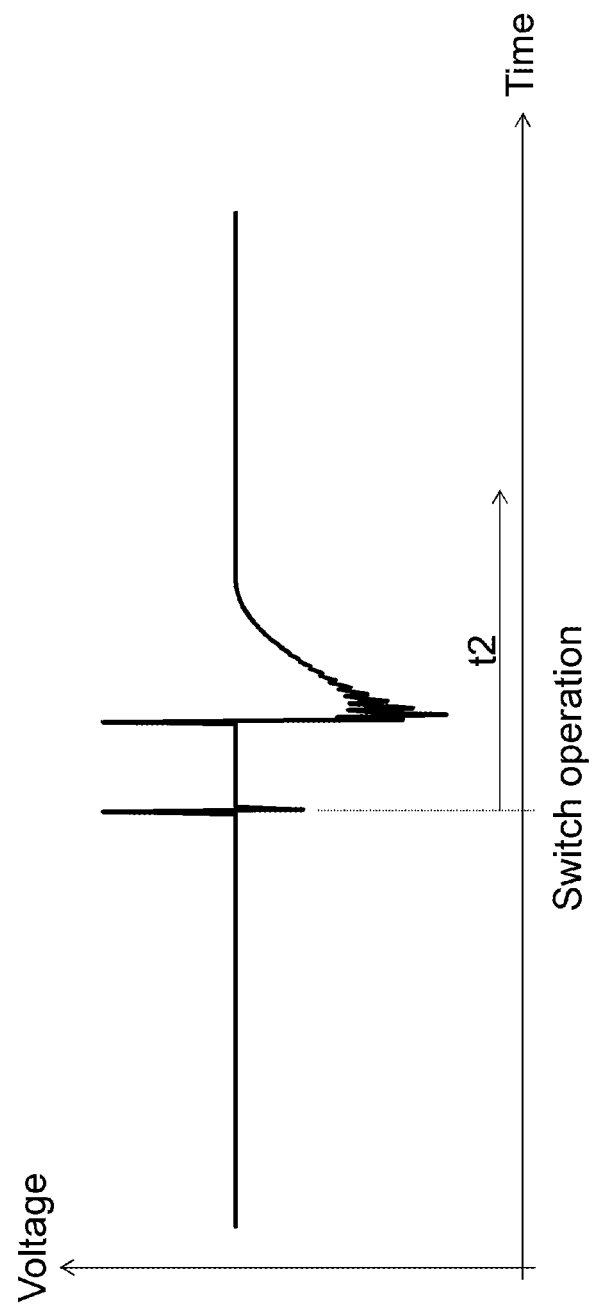
FIG. 10 is a graph illustrating the voltage waveform of FIG. 9 from which the sine wave based on the power from the power source to be tested is removed.

This voltage waveform (normal voltage waveform) in the case of being normally operated, is obtained by removing the sine wave, based on the AC waveform of the power supplied from the power source to be tested to the resistor unit 20, from an approximate sine waveform (see FIG. 9) obtained by arranging voltage values obtained through a test or the like in advance before performing a load test in a time-series manner, and thus, shows a substantially constant waveform except for the voltage change when the relay RS is changed from the on state to the off state or from the off state to the on state (see FIG. 10).

Incidentally, the calculation of removing the sine waveform is not performed in a case where the voltage waveform, obtained through the test or the like in advance before performing the load test, does not include the sine wave corresponding to the power from the power source to be tested, such as the case where the power source to be tested is the DC power source.

When the relay RS normally operates, a difference is hardly generated between the detection voltage waveform obtained from the first voltage detection unit 20a1 to the third voltage detection unit 20a3 and recorded in the control unit 80 or the like and the normal voltage waveform recorded in the control unit 80 or the like in advance.

On the other hand, when the relay RS does not normally operate, a difference is highly likely to be generated between the detection voltage waveform obtained from the first voltage detection unit 20a1 to the third voltage detection unit 20a3 and recorded in the control unit 80 or the like and the normal voltage waveform recorded in the control unit 80 or the like in advance.

For example, when the first switch S1 and the second switch S2 are turned on, the third switch S3 and the fourth switch S4 are turned off, and the third switch S3 is turned on, the voltage waveform (detection voltage waveform) during the second time period t2 from the time at which the third switch S3 is turned on and the voltage waveform (normal voltage waveform) during the normal operation when the third switch S3 is turned on from such a state are compared with each other.

That is, it is desirable that the control unit 80 records patterns of the voltage waveform during the normal operation when one or more switches are operated from various switch states as the reference information.

When the difference between the detection voltage waveform and the normal voltage waveform recorded in advance is great, the control unit 80 determines that the voltage waveform is out of the normal operation range and turns the main switch 50 into the off state to stop the power supply from the power source to be tested to the resistor unit 20 of the load testing apparatus 1.

In this case, there is a high possibility that the relay RS corresponding to the selection switch 60b, which has been operated during the past first time t1, does not normally operate (there is an abnormality in the relay RS), and the control unit 80 lights up the current/voltage warning unit 61d in the vicinity of the corresponding switch as an output of the information about the relay RS determined not to normally operate based on the result of the comparison between the detection information and the reference information (see step S19).

That is, the control unit 80 determines whether the relay RS normally operates based on the detection information (detection voltage waveform), which is the information from the electrical signal detection unit 20a and includes the time-series change of the voltage when the selection switch 60b is operated, and performs the off control to stop the power supply from the power source to be tested to the resistor unit 20 when it is determined that the relay RS does not normally operate.

When the difference between the detection voltage waveform and the normal voltage waveform is great in a case where a plurality of switches are operated substantially at the same time, there is a high possibility that the relay RS corresponding to at least one of the plurality of switches has an abnormality, and the control unit 80 lights up the current/voltage warning unit 61d in the vicinity of the plurality of switches.

When any of the selection switches 60b is operated a plurality of times during the past first time t1, the control unit 80 compares each of the voltage waveforms (detection voltage waveforms) in the second time period t2 from the time at which the operation is performed with the voltage waveform (normal voltage waveform) in the case of being normally operated in the same switch operation state, and performs the off control to light up the current/voltage warning unit 61d in the vicinity of the operated switch when the difference is great.

It is possible to consider a mode of lighting up one, which is arranged in the vicinity of the switch corresponding to the relay RS that is highly likely to cause the failure, among the current/voltage warning units 61d (the first warning unit 61d1 to the fourth warning unit 61d4) provided in the vicinity of the first switch S1 to the fourth switch S4 in the operation unit 60 as an example of the warning.

In addition, the warning may be performed in a mode of providing the display device 70 capable of displaying characters in the operation unit 60 or the like and displaying a message saying, for example, "(Since the waveform of the voltage applied to the first resistor group corresponding to the first switch is not normal,) Confirm the relay corresponding to the first switch (the relay of the first resistor group)".

Incidentally, it is understood that the relay connected to the U-phase wire UB or the relay connected to the V-phase wire VB has an abnormality when the abnormality is detected in a voltage waveform detected by the first voltage detection unit 20a1, it is understood that the relay connected to the V-phase wire VB or the relay connected to the W-phase wire WB has an abnormality when the abnormality is detected in a voltage waveform detected by the second voltage detection unit 20a2, and it is understood that the relay connected to the W-phase wire WB or the relay connected to the U-phase wire UP has an abnormality when the abnormality is detected in a voltage waveform detected by the third voltage detection unit 20a3.

Thus, it is also possible to specify the relay RS having the abnormality. In other words, it is possible to determine if the abnormal relay is the one for the U-phase wire, the V-phase wire, or the W-phase wire.

For example, in a case where the abnormality is detected in the voltage waveform detected by the first voltage detection unit 20a1 and the voltage waveform detected by the second voltage detection unit 20a2 when the first switch S1 is operated, it is possible to specify that there is the abnormality in the relay RS corresponding to the first switch S1, that is, the relay RS of the first resistor group G1 which is the relay for the V-phase wire.

Thus, the warning may be displayed in a mode of indicating which one of the relays RS has the abnormality among the relay for the U-phase wire, the relay for the V-phase wire, and the relay for the W-phase wire.

For example, it is possible to consider a mode of providing three warning devices in the vicinity of each of the first switch S1 to the fourth switch S4 and lighting up the warning device corresponding to a relay determined to have an abnormality among the relay for the U-phase wire, the relay for the V-phase wire, and the relay for the W-phase wire.

Figure 11:
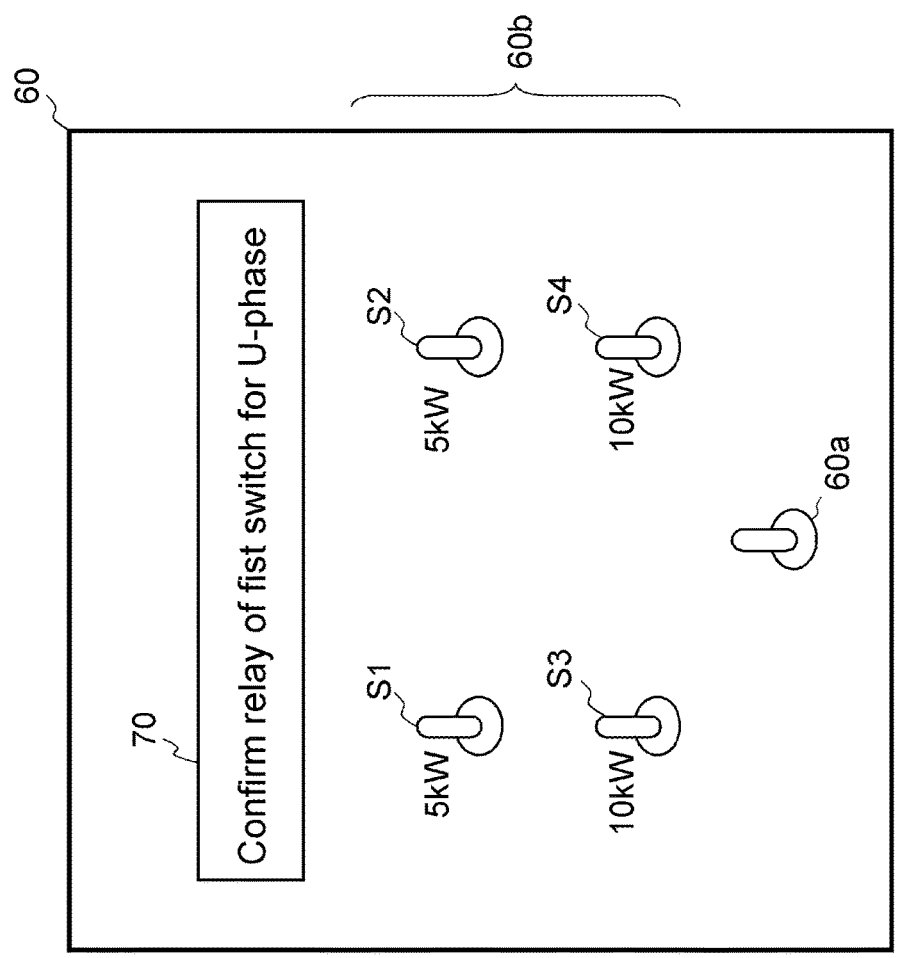
FIG. 11 is a schematic view illustrating a configuration of an operation unit in a mode where a display device is provided in the operation unit.
Figure 12:
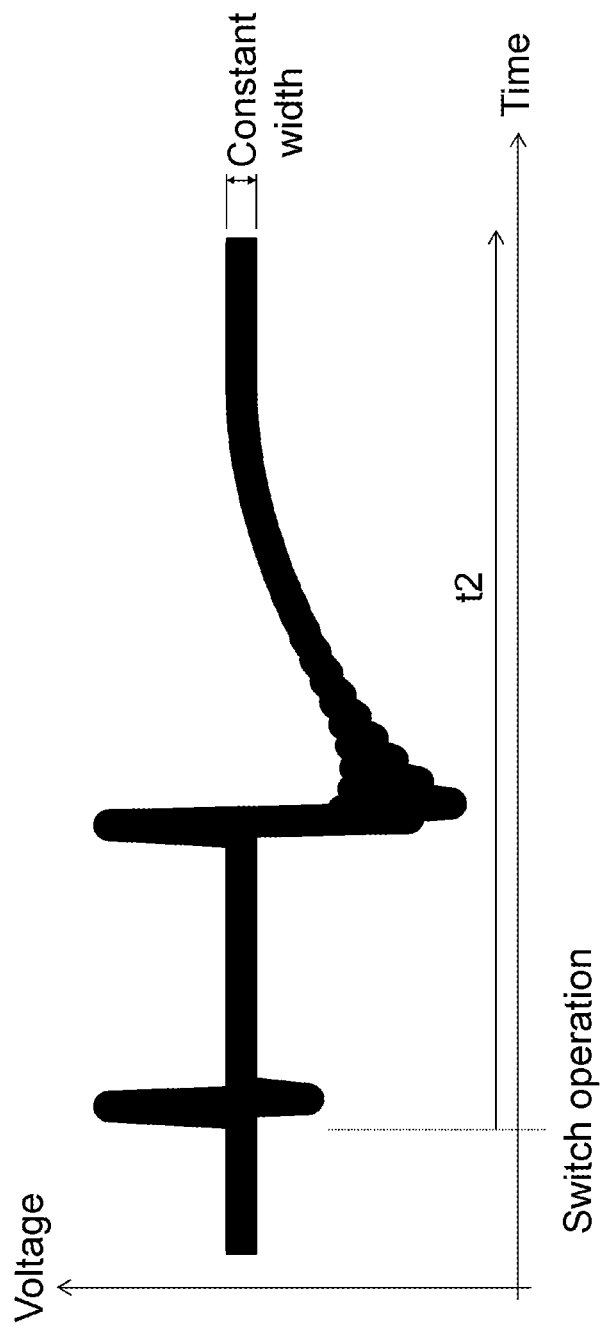
FIG. 12 is a graph illustrating a region (normal waveform region) where a constant width is provided at upper, lower, right and left sides to the voltage waveform in the case of a normal operation of FIG. 10.

In addition, the warning may be performed in a mode of displaying a message that specifically indicates a relay which is highly likely to have an abnormality in the display device 70, such as "(Since the waveform of the voltage applied to the first resistor group corresponding to the first switch is not normal,) Confirm the relay for the U-phase wire which corresponds to the first switch (the relay of the first resistor group)" (see FIG. 11).

The comparison of the voltage waveform is performed, for example, by setting a region (normal waveform region, see FIG. 12) where a constant width is provided at upper, lower, right and left sides to the voltage waveform in the case of the normal operation (see FIG. 10) and determining whether the detection voltage waveform falls within a range of the normal waveform region. The normal waveform region includes the normal voltage waveform and is represented in a curve having a constant width (reference waveform region).

To be more specific, it is possible to consider a mode of determining whether each voltage value represented in the detection voltage waveform falls within the range of the normal waveform region by superimposing the detection voltage waveform on the normal waveform region or the like, and determining that the relay RS corresponding to the operated selection switch 60b normally operates if a time zone included in the range of the normal waveform region is equal to or longer than a threshold, and determining that the corresponding relay RS does not normally operate if the time zone is shorter than the threshold.

When the detection voltage waveform before removing the sine wave corresponding to the power from the power source to be tested is as illustrated in FIG. 6, the voltage waveform after the switch operation and from which the sine wave is removed (see FIG. 8) is out of the range of the normal waveform region (see FIG. 12) (the time zone of the detection voltage waveform which is in the range of the normal waveform region is short), and thus, it is determined that the relay RS corresponding to the operated selection switch 604 does not normally operate.

Figure 13:
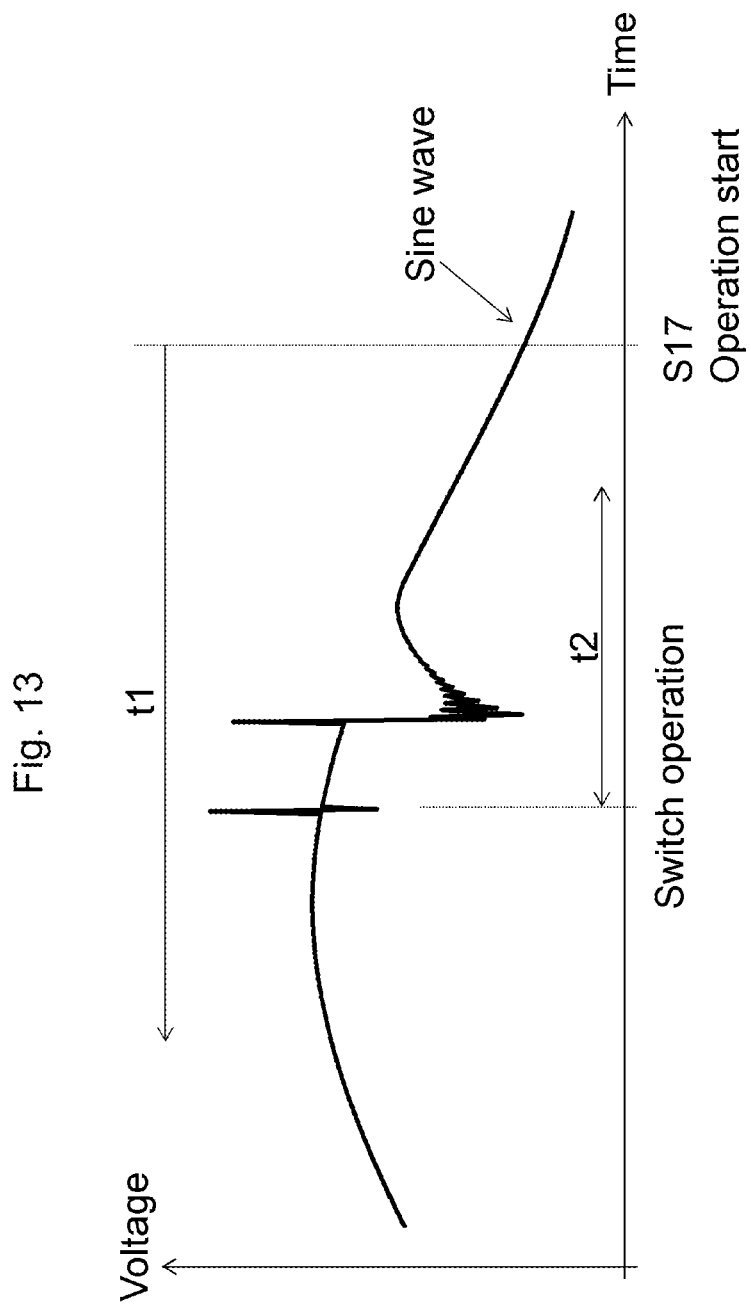
FIG. 13 is a graph illustrating an example of a detection voltage waveform at the normal time which includes a sine wave based on the power from the power source to be tested.

When the detection voltage waveform before removing the sine wave corresponding to the power from the power source to be tested is as illustrated in FIG. 13, the voltage waveform after the switch operation and from which the sine wave is removed is substantially equal to that illustrated in FIG. 10 and included in the range of the normal waveform region (see FIG. 12) (the time zone of the detection voltage waveform which is in the range of the normal waveform region is long), and thus, it is determined that the relay RS corresponding to the operated selection switch 60b normally operates.

Incidentally, the invention may be configured in a mode of providing a plurality of thresholds and providing a stage of performing only the warning (information output) without performing the off control and a stage of performing both the off control and the warning.

For example, it is possible to consider a mode where it is determined that there is a high possibility that the relay RS corresponding to the operated selection switch 60b does not normally operate so that the display of warning as well as the off control is performed when the time zone of the detection voltage waveform which is in the range of the normal waveform region is shorter than a first threshold, it is determined that there is a high possibility that the relay RS corresponding to the operated selection switch 60b does not come to operate normally in the future and the time for replacement is near so that only the warning display (for example, display that there is the relay RS which is highly likely to malfunction in the near future and repair or replacement is recommended) is performed without performing the off control when the time zone is equal to or longer than the first threshold and is shorter than a second threshold (the second threshold>the first threshold), and it is determined that there is a high possibility that the relay RS corresponding to the operated selection switch normally operates so that the off control and the warning display are not performed when the time zone is equal to or longer than the second threshold.

Through such warning, the time for replacement of the relay RS can be notified before the load testing apparatus 1 is incapable of normally operating due to the malfunction.

The description has been given in the present embodiment regarding the mode where the pattern of the voltage waveform during the normal operation is recorded in advance as the reference information, it is determined that the relay RS normally operates when the detection voltage waveform is similar (included in the range of the normal waveform region) to the voltage waveform during the normal operation thereof, and it is determined that the relay RS does not normally operate when the detection voltage waveform is not similar thereto.

However, the invention may be configured in a mode where several patterns of voltage waveforms during an abnormal operation are recorded as reference information, and it is determined that the relay RS does not normally operate when the detection voltage waveform is similar to any of the voltage waveforms during the abnormal operation.

In addition, the invention may be configured in a mode of measuring a length of time from the time when the switch is operated to a steady state where a voltage change (a change amount (width) of a voltage value in a unit time) becomes smaller than a predetermined amount and performing abnormality determination by comparing the measured length with that of the normal operation, instead of the mode of performing the abnormality determination by comparing the pattern of the voltage waveform with that of the normal operation.

When none of the selection switches 60b (the first switch S1 to the fourth switch S4) is operated during the past first time t1 in the voltage waveform based on the determination in step S17 or when it is determined that the relay RS normally operates after any of the selection switches 60b is operated based on the determination in step S18, the process proceeds to step S20.

Incidentally, the invention may be configured in a mode where the control unit 80 determines the abnormality of the resistor unit 20 when none of the selection switches 60b (the first switch S1 to the fourth switch S4) is operated during the past first time t1 in the voltage waveform.

To be specific, the control unit 80 compares a voltage value at the present time point (or an average value of voltages during the past second time period t2 up to the present time point) with a voltage value during the normal operation that corresponds to the switch state at the present time point, based on the voltage waveform obtained by the first voltage detection unit 20a1 to the third voltage detection unit 20a3.

That is, it is desirable that the control unit 80 records the voltage values in various switch states in advance in the case of performing the detection on the abnormality of the resistor unit 20.

When the difference between the voltage value of the detection result and the voltage value during the normal operation recorded in advance is great, the control unit 80 determines that the voltage is out of the normal operation range and turns the main switch 50 into the off state to stop the power supply from the power source to be tested to the resistor unit 20 of the load testing apparatus 1.

In this case, there is a high possibility that at least one resistor of the resistor group corresponding to the turned-on switch has the abnormality, and the control unit 80 lights up the current/voltage warning unit 61d in the vicinity of the turned-on switch.

It is desirable that different lighting operations be performed between the failure warning of the relay RS and the failure warning of the resistor for the lighting of the current/voltage warning unit 61d in order to distinguish the lighting for the failure warning of the relay RS and the lighting for the failure warning of the resistor. Alternatively, the invention may be configured in a mode of providing a lighting device for the failure warning of the resistor that is different from a lighting device for the failure warning of the relay RS.

The control unit 80 determines whether the exhaust temperature exceeds a temperature threshold (see step S20) based on the information from the temperature detection unit 20b about the exhaust temperature, and turns the main switch 50 into the off state to stop the power supply from the power source to be tested to the resistor unit 20 of the load testing apparatus 1 when it is determined that the exhaust temperature exceeds the temperature threshold. In addition, the control unit 80 performs warning to indicate "the resistor is not normally cooled" (see step S21).

It is possible to consider a mode of lighting up the temperature warning unit 61e provided in the vicinity of a column "Exhaust Temperature" in the operation unit 60 as an example of the warning. In addition, the warning may be performed in a mode of providing the display device 70 capable of displaying characters in the operation unit 60 or the like and displaying a message saying "Since the resistor is not normally cooled, confirm the respective units".

When the load testing apparatus 1 normally operates, the intake of the cooling fan 10 is performed from the opening part (the intake port 31) where the intake lid 32 is opened, and the blast from the cooling fan 10 passes through the resistor unit 20 and discharged from the opening part (the exhaust port 33) where the exhaust lid 34 is opened.

The resistor of the resistor group energized by being supplied with the power from the power source to be tested generates heat.

If the intake and the exhaust are normally performed, the cooling fan 10 normally operates, and the voltage applied to the resistor falls within the normal range, the resistor is cooled by the blast from the cooling fan 10 and hot air is discharged from the exhaust port 33 so that it is possible to safely perform the load test.

Since the intake is not sufficiently performed when the intake lid 32 is not normally opened, a state is formed where it is difficult for the cooling fan 10 to sufficiently blow the blast into the resistor.

Since the exhaust is not sufficiently performed when the exhaust lid 34 is not normally opened, a state is formed where the blast from the cooling fan 10 hardly flows through the resistor.

Since it is difficult to blow a predetermined amount of blast to the resistor unit 20 when the cooling fan 10 does not normally operate (does not normally rotate), a state is formed where the resistor is hardly cooled.

If carbide is accumulated at a contact point (a fixed contact point or a movable contact point) of the relay RS, the contact resistance thereof increases, and the contact failure is likely to occur.

Since the voltage to be applied to the resistor becomes higher due to short circuit or the like when the resistor is damaged or dust is attached thereto, a state is formed where the resistor is hardly cooled even if the cooling fan 10 normally operates.

In addition, it is considered a case where the state is formed where the resistor is hardly cooled when the cooling capacity is low and the temperature of an object to be cooled is high although the respective devices normally operate such as a case where the rotation speed is low (close to a lower limit value of the normal operation range) although the cooling fan 10 falls within the normal operation range and the voltage value is high (close to a upper limit value of the normal operation range) although the voltage applied to the resistor also falls within the normal operation range. In addition, the case where the resistor is hardly cooled may occur even when a foreign object is mixed into the resistor unit 20 or the like, the cooling fan 10 normally operates, and a voltage in a normal range is applied to the resistor group.

In the present embodiment, the control unit 80 performs the off control of the main switch 50 upon detecting the operating condition of the cooling fan 10 using the rotation state detection unit 10a, the voltage condition of the resistor unit 20 using the electrical signal detection unit 20a, the opened state of the opening part (the intake port 31 and the exhaust port 33) in the housing 30 using the intake opening detection unit 32b and the exhaust opening detection unit 34b, and the exhaust temperature at the downstream side (in the vicinity of the exhaust port 33) of the resistor unit 20 using the temperature detection unit 20b, and thus, the power supply from the power source to be tested to the load testing apparatus 1 (the resistor unit 20) is stopped when the failure occurs in the load testing apparatus 1. Thus, it is possible to suitably perform the abnormality detection inside the load testing apparatus 1 and to prevent further malfunction of the load testing apparatus 1.

In particular, the abnormality of the relay RS corresponding to the selection switch 60b (the first switch S1 to the fourth switch S4) is detected using the electrical signal detection unit 20a. A change of the waveform immediately after the operation of the selection switch 60b is highly likely to be caused by the failure (particularly, the contact failure) of the relay RS corresponding to the operated selection switch 60b rather than by the failure of the resistor.

If the contact failure is caused as the carbide is accumulated at the contact point (the fixed contact point or the movable contact point) of the relay RS or the like, the voltage waveform (see FIG. 8) at the time of being turned on or off differs from the voltage waveform (see FIG. 10) during the normal operation, and thus, it is possible to detect the failure of the relay RS using a difference in the voltage waveform (a temporal change of the voltage value).

Thus, it is possible to determine whether the relay RS corresponding to the operated selection switch 60b normally operates by comparing the detection information (detection voltage waveform), which includes the time-series change of the voltage when the selection switch 60b is operated, with the reference information recorded in advance such as the normal voltage waveform.

In addition, even when there is an abnormality in any sensor, it is possible to detect the abnormality using another sensor since the abnormality is detected using the plurality of sensors. For example, even in a state where it is difficult to detect the abnormality in the rotation state of the cooling fan 10 due to the failure in the rotation state detection unit 10a, it is possible to detect that the exhaust temperature is higher than a normal value using the temperature detection unit 20b, and thus, it is possible to find the abnormality as a whole.

In addition, possible to visually confirm whether the abnormality is caused due to a problem in the opening of the lid, the operation failure of the cooling fan 10, the failure of the relay RS (and identification of the relay RS having the failure), or another failure (or overall failure) by performing the warning using the intake lid warning unit 61a and the like and indicating a portion of the failure, and there is also a merit that the failure can be easily improved.

Figure 14:
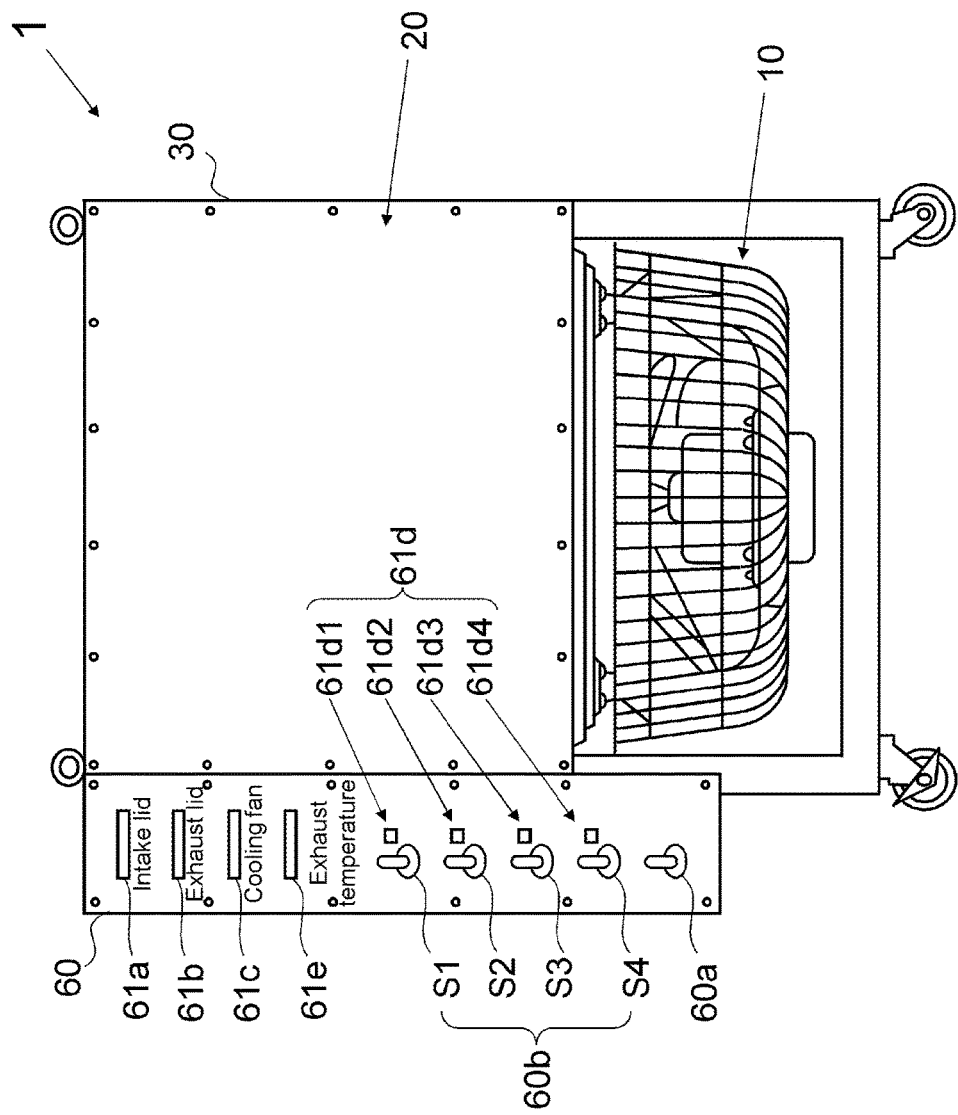
FIG. 14 is a side view of the load testing apparatus for a low voltage using off control according to the present embodiment.
Figure 15:
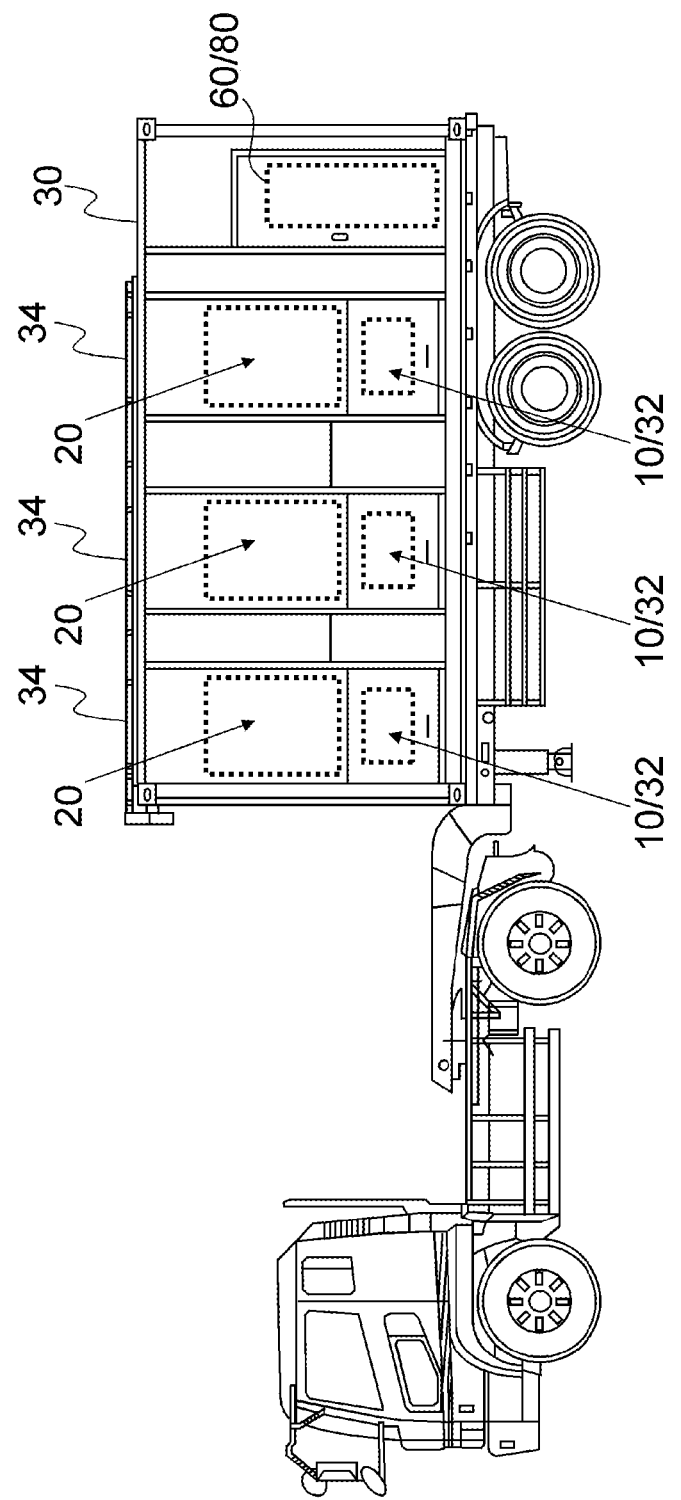
FIG. 15 is a side view of the load testing apparatus for a high voltage using the off control according to the present embodiment.

Incidentally, the load testing apparatus 1 according to the present embodiment can be applied to a load testing apparatus for a low voltage in response to a low-voltage power source as illustrated in FIG. 14 and can be also applied to a load testing apparatus for a high voltage in response to a high-voltage power source as illustrated in FIG. 15.

Meanwhile, there is a load testing apparatus in which the intake lid 32 and the exhaust lid 34 are not provided so that the intake port 31 and the exhaust port 33 are constantly opened, and in this case, the intake opening detection unit 32b and the exhaust opening detection unit 34b are not provided (see FIG. 14).

In addition, the warning may be performed in the mode of outputting the light to allow the user to visually confirm, or a mode of outputting sound or a warning mode of using both the light and the sound.

Figure 16:
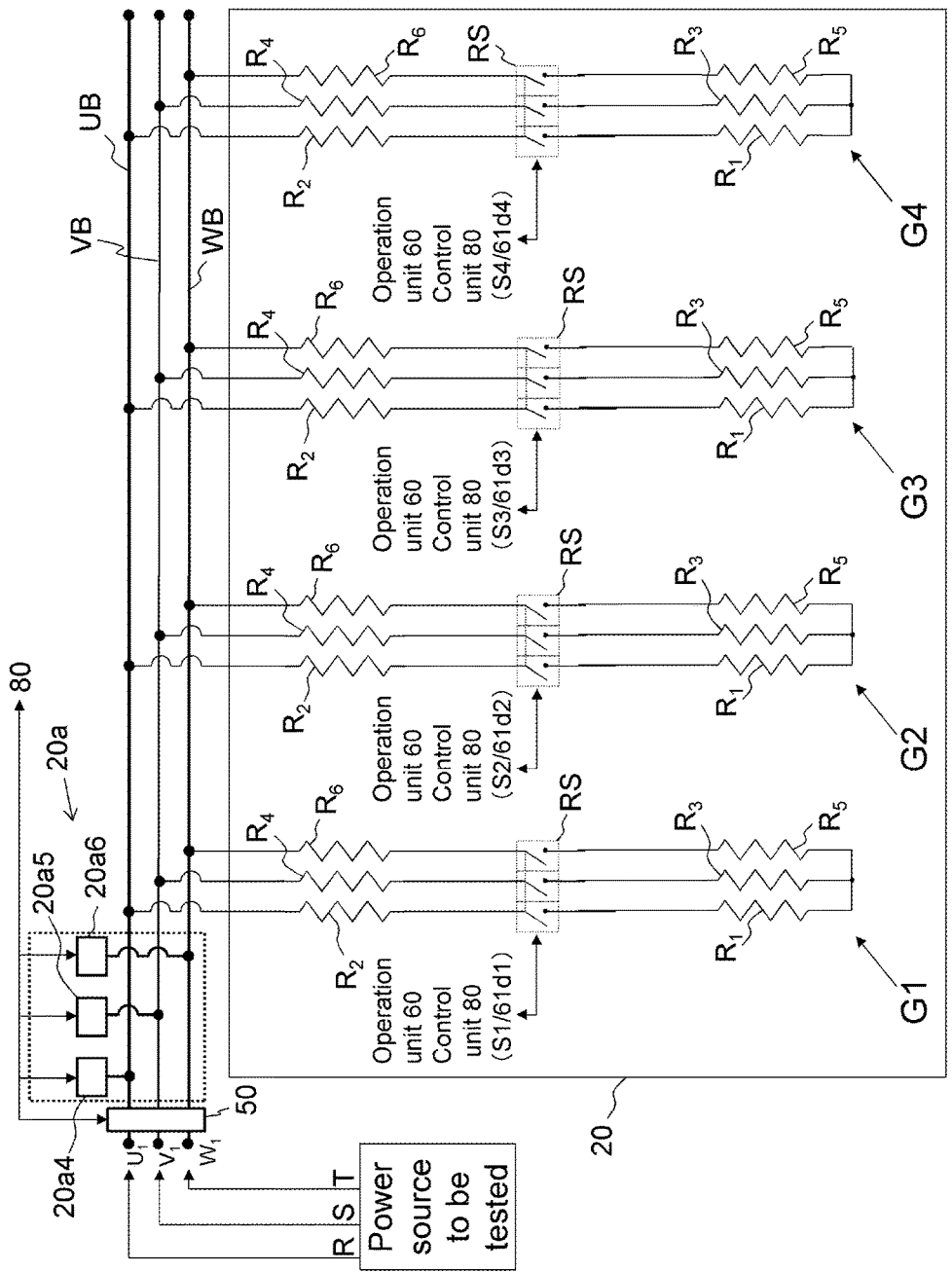
FIG. 16 is a schematic view illustrating a circuit configuration of a resistor unit which includes a first current detection unit to a third current detection unit.

In addition, the description has been given in the present embodiment regarding the mode where the abnormality detection of the relay RS is performed based on the waveform of the voltage applied to the resistor unit 20 (the time-series change of the voltage) when the selection switch 60b is operated, but the invention may be configured in a mode where the abnormality detection of the relay RS is performed based on a waveform of a current (a time-series change of a current) flowing through the resistor unit 20 when the selection switch 60b is operated (see FIG. 16).

In this case, the electrical signal detection unit 20a includes a first current detection unit 20a4 to a third current detection unit 20a6.

The first current detection unit 20a4 is provided between the resistor unit 20 and the main switch 50 (or between the power source to be tested and the main switch 50) on the U-phase wire UB and detects a current flowing through the resistors for the U-phase (the first resistor $R_1$ and the second resistor $R_2$).

The second current detection unit 20a5 is provided between the resistor unit 20 and the main switch 50 (or between the power source to be tested and the main switch 50) on the V-phase wire VB and detects a current flowing through the resistors for the V-phase (the third resistor $R_3$ and the fourth resistor $R_4$).

The third current detection unit 20a6 is provided between the resistor unit 20 and the main switch 50 (or between the power source to be tested and the main switch 50) on the W-phase wire WB and detects a current flowing through the resistors for the W-phase (the fifth resistor $R_5$ and the sixth resistor $R_6$).

In addition, the operations in step S17 to step S19 of FIG. 5 in this case are substituted as follows.

The control unit 80 determines whether the current flowing through the resistor unit 20 falls within a range during the normal operation based on the information from the electrical signal detection unit 20a about the current flowing through the resistor unit 20 and turns the main switch 50 into the off state to stop the power supply from the power source to be tested to the resistor unit 20 of the load testing apparatus 1 when it is determined that the voltage is out of the range during the normal operation. In addition, the control unit 80 performs warning to indicate "the waveform of the current flowing to the resistor unit 20 during the switch operation is not normal".

To be specific, the control unit 80 records the current waveform (detection current waveform or detection information) which is obtained from the first current detection unit 20a4 to the third current detection unit 20a6 and represents changes of a current value in a time-series manner (for example, updates every 1 ms).

This current waveform (detection current waveform) to be obtained from the first current detection unit 20a4 to the third current detection unit 20a6 and recorded in the control unit 80 or the like is obtained by removing a sine wave, based on an AC waveform of the power supplied from the power source to be tested to the resistor unit 20, from an approximate sine waveform obtained by arranging the detected current values in a time-series manner, and thus, shows a substantially constant waveform except for a current change when the relay RS is changed from the on state to the off state or from the off state to the on state.

Incidentally, the calculation of removing the sine waveform is not performed in a case where the detected waveform does not include the sine wave corresponding to the power from the power source to be tested, such as a case where the power source to be tested is a DC power source.

The control unit 80 determines whether any of the selection switches 60b (the first switch S1 to the fourth switch S4)

is operated during the past first time t1 dating back from the present time point (operation start time point in step S17) in the detection current waveform (see step S17).

When any of the selection switches 60b (the first switch S1 to the fourth switch S4) is operated during the past first time t1 in the detection current waveform, the control unit 80 compares a detection current waveform in a second time period t2 (<t1, for example, 1 ms) from the time at which the switch is operated with a current waveform (normal current waveform or reference information) obtained in the case of being normally operated in the same switch operation state (see step S18).

This current waveform (normal current waveform) in the case of being normally operated, is obtained by removing the sine wave, based on the AC waveform of the power supplied from the power source to be tested to the resistor unit 20, from an approximate sine waveform obtained by arranging current values obtained through a test or the like in advance in a time-series manner, and thus, shows a substantially constant waveform except for the current change when the relay RS is changed from the on state to the off state or from the off state to the on state.

Incidentally, the calculation of removing the sine waveform is not performed in a case where the current waveform, obtained through the test or the like in advance before performing the load test, does not include the sine wave corresponding to the power from the power source to be tested, such as the case where the power source to be tested is the DC power source.

When the relay RS normally operates, a difference is hardly generated between the detection current waveform obtained from the first current detection unit 20a4 to the third current detection unit 20a6 and recorded in the control unit 80 or the like and the normal current waveform recorded in the control unit 80 or the like in advance.

On the other hand, when the relay RS does not normally operate, a difference is highly likely to be generated between the detection current waveform obtained from the first current detection unit 20a4 to the third current detection unit 20a6 and recorded in the control unit 80 or the like and the normal current waveform recorded in the control unit 80 or the like in advance.

For example, when the first switch S1 and the second switch S2 are turned on, the third switch 83 and the fourth switch S4 are turned off, and the third switch S3 is turned on, the current waveform (detection current waveform) during the second time period t2 from the time at which the third switch S3 is turned on and the current waveform (normal current waveform) during the normal operation when the third switch S3 is turned on from such a state are compared with each other.

That is, it is desirable that the control unit 80 records patterns of the current waveform during the normal operation when one or more switches are operated from various switch states as the reference information.

When the difference between the detection current waveform and the normal current waveform recorded in advance is great, the control unit 80 determines that the current waveform is out of the normal operation range and turns the main switch 50 into the off state to stop the power supply from the power source to be tested to the resistor unit 20 of the load testing apparatus 1.

In this case, there is a high possibility that the relay RS corresponding to the selection switch 60b, which has been operated during the past first time t1, does not normally operate (there is an abnormality in the relay RS), and the control unit 80 lights up the current/voltage warning unit 61d in the vicinity of the corresponding switch as an output of the information about the relay RS (the relay RS that does not normally operate) specified based on the result of the comparison between the detection information and the reference information (see step S19).

When the difference between the detection current waveform and the normal current waveform is great in a case where a plurality of switches are operated substantially at the same time, there is a high possibility that the relay RS corresponding to at least one of the plurality of switches has an abnormality, and the control unit 80 lights up the current/voltage warning unit 61d in the vicinity of the plurality of switches.

When any of the selection switches 60b is operated a plurality of times during the past first time t1, the control unit 80 compares each of the current waveforms (detection current waveforms) in the second time period t2 from the time at which the operation is performed with the current waveform (normal current waveform) in the case of being normally operated in the same switch operation state, and performs the off control to light up the current/voltage warning unit 61d in the vicinity of the operated switch when the difference is great.

It is possible to consider a mode of lighting up one, which is arranged in the vicinity of the switch corresponding to the relay RS that is highly likely to cause the failure, among the current/voltage warning units 61d (the first warning unit 61d1 to the fourth warning unit 61d4) provided in the vicinity of the first switch S1 to the fourth switch S4 in the operation unit 60 as an example of the warning.

In addition, the warning may be performed in a mode of providing the display device 70 capable of displaying characters in the operation unit 60 or the like and displaying a message saying, for example, "(Since the waveform of the current flowing through the first resistor group corresponding to the first switch is not normal,) Confirm the relay corresponding to the first switch (the relay of the first resistor group)".

Incidentally, it is understood that the relay connected to the U-phase wire UB has an abnormality when the abnormality is detected in a current waveform detected by the first current detection unit 20a4, it is understood that the relay connected to the V-phase wire VB has an abnormality when the abnormality is detected in a current waveform detected by the second current detection unit 20a5, and it is understood that the relay connected to the W-phase wire WB has an abnormality when the abnormality is detected in a current waveform detected by the third current detection unit 20a6.

Thus, it is also possible to specify the relay RS having the abnormality. In other words, it is possible to determine if the abnormal relay is the one for the U-phase wire, the V-phase wire, or the W-phase wire.

For example, in a case where the abnormality is detected in the current waveform detected by the first current detection unit 20a4 when the first switch S1 is operated, it is possible to specify that there is the abnormality in the relay RS corresponding to the first switch S1, that is, the relay RS of the first resistor group G1 which is the relay for the U-phase wire.

The comparison of the current waveform is performed in the same manner as the comparison of the voltage waveform.

The description has been given in the present embodiment regarding the mode where the pattern of the current waveform during the normal operation is recorded in advance as the reference information, it is determined that the relay RS normally operates when the detection current waveform is similar (included in the range of the normal waveform region) to the current waveform during the normal operation thereof, and it is determined that the relay RS does not normally operate when the detection current waveform is not similar thereto.

However, the invention may be configured in a mode where several patterns of current waveforms during an abnormal operation are recorded as reference information, and it is determined that the relay RS does not normally operate when the detection current waveform is similar to any of the current waveforms during the abnormal operation.

In addition, the invention may be configured in a mode of measuring a length of time from the time when the switch is operated to a steady state where a current change (a change amount (width) of a current value in a unit time) becomes smaller than a predetermined amount and performing abnormality determination by comparing the measured length with that of the normal operation, instead of the mode of performing the abnormality determination by comparing the pattern of the current waveform with that of the normal operation.

In addition, the electrical signal detection unit 20a may be configured in a mode of detecting at least one of the current and the voltage, or a mode of detecting both the current and the voltage in order to accurately detect the abnormality.

REFERENCE SINGS LIST 1 load testing apparatus
10 cooling fan
10a rotation state detection unit
20 resistor unit
20a electrical signal detection unit
20a1 to 20a3 first voltage detection unit to third voltage detection unit
20a4 to 20a6 first current detection unit to third current detection unit
20b temperature detection unit
30 housing
31 intake port
32 intake lid
32a first actuator
32b intake opening detection unit
33 exhaust port
34 exhaust lid
34a second actuator
34b exhaust opening detection unit
50 main switch
60 operation unit
60a on/off operation switch
60b selection switch
61a intake lid warning unit
61b exhaust lid warning unit
61c cooling fan warning unit
61d current/voltage warning unit
61d1 to 61d4 first warning unit to fourth warning unit
61e temperature warning unit
70 display device
80 control unit
G1 to G4 first resistor group to fourth resistor group
$R_1$ to $R_6$ first resistor to sixth resistor
RS relay
S1 to S4 first switch to fourth switch
$U_1$ U-phase terminal
UB U-phase wire
$V_1$ V-phase terminal
VB V-phase wire
$W_1$ W-phase terminal
WB W-phase wire

The invention claimed is:

1. A load testing apparatus comprising:
 a resistor unit that has a resistor group including relays and resistors and is connected to a power source to be tested to perform a load test;
 a selection switch that is used to select whether to supply power from the power source to be tested to the resistor group;
 an electrical signal detection unit that detects at least one of a voltage applied to the resistor unit and a current flowing through the resistor unit; and
 a control unit,
 wherein:
 the relay operates in response to an on/off state of the selection switch to control power supply from the power source to be tested to the resistor group including the relay;
 the control unit receives detection information from the electrical signal detection unit, the detection information including a signal line that represents a time-series change of at least one of the voltage and the current when the selection switch is operated;
 the control unit performs a comparison between the detection information and reference information;
 based on a result of the comparison, the control unit performs determination on whether the relay operates in a normal manner;
 the control unit performs off control to stop power supply from the power source to be tested to the resistor unit when it is determined that the relay does not operate in a normal manner;
 the reference information is recorded in advance before performing the load test;
 the reference information includes a curved signal line with a predetermined line thickness; and
 the control unit performs the determination based on a length of a time zone, in which the signal line included in the detection information falls within the curved signal line with the predetermined line thickness when the signal line included in the detection information is superimposed on the curved signal line with the predetermined line thickness.

2. The load testing apparatus according to claim 1, wherein
 when the power source to be tested is an AC power source, the comparison is performed using the reference information and the detection information from which a sine wave, obtained based on an AC waveform of power supplied from the power source to be tested to the resistor unit, is removed.

3. The load testing apparatus according to claim 2, further comprising
 a warning unit that outputs information using at least one of light and sound during the off control, wherein:
 if the control unit determines that the relay does not operate in the normal manner, based on the result of the comparison;
 in addition to performing the off control, the control unit outputs information about the relay to the warning unit.

4. The load testing apparatus according to claim 3, wherein
 the power source to be tested is an AC power source,
 the electrical signal detection unit includes a first voltage detection unit which detects a voltage applied to a resistor for U-phase and a resistor for V-phase in the resistor unit, a second voltage detection unit which detects a voltage applied to the resistor for the V-phase and a resistor for W-phase in the resistor unit, and a third voltage detection unit which detects a voltage applied to the resistor for the W-phase and the resistor for the U-phase, and the detection information is information from the first voltage detection unit, the second voltage detection unit, and the third voltage detection unit.

5. The load testing apparatus according to claim 3, wherein the power source to be tested is an AC power source, the electrical signal detection unit includes a first current detection unit which detects a current flowing through a resistor for U-phase in the resistor unit, a second current detection unit which detects a current flowing through a resistor for V-phase in the resistor unit, and a third current detection unit which detects a current flowing through a resistor for W-phase in the resistor unit, and the detection information is information from the first current detection unit, the second current detection unit, and the third current detection unit.

6. The load testing apparatus according to claim 1, wherein the control unit determines that the relay does not operate in a normal manner, if the length of the time zone, in which the signal line included in the detection information falls within the curved signal line with the predetermined line thickness, is shorter than a first threshold when the signal line included in the detection information is superimposed on the curved signal line with the predetermined line thickness.

7. The load testing apparatus according to claim 6, further comprising a warning unit that outputs information using at least one of light and sound during the off control, wherein the control unit does not perform the off control but causes the warning unit to output the information in a case where the length of the time zone of the waveform representing the detection information that is included in the curved signal line with the predetermined line thickness is equal to or longer than the first threshold and is shorter than a second threshold, which is larger than the first threshold, when the waveform representing the detection information is superimposed on the curved signal line with the predetermined line thickness.

8. The load testing apparatus according to claim 1, wherein the control unit performs the determination based on the detection information for a certain period of time from the operation of the selection switch.

* * * * *